(12) United States Patent
Krishnan et al.

(10) Patent No.: US 11,694,145 B2
(45) Date of Patent: Jul. 4, 2023

(54) SYSTEM AND METHOD FOR UNIVERSAL MAPPING OF STRUCTURED, SEMI-STRUCTURED, AND UNSTRUCTURED DATA FOR APPLICATION MIGRATION IN INTEGRATION PROCESSES

(71) Applicant: BOOMI, INC., Round Rock, TX (US)

(72) Inventors: Ravikiran Krishnan, Foster City, CA (US); Zeyu Su, Mountain View, CA (US)

(73) Assignee: BOOMI, LP, Chesterbrook, PA (US)

( * ) Notice: Subject to any disclaimer, the term of this patent is extended or adjusted under 35 U.S.C. 154(b) by 512 days.

(21) Appl. No.: 16/942,746

(22) Filed: Jul. 29, 2020

(65) Prior Publication Data
US 2022/0036260 A1 Feb. 3, 2022

(51) Int. Cl.
| | |
|---|---|
| *G06F 16/906* | (2019.01) |
| *G06Q 10/067* | (2023.01) |
| *G06N 5/04* | (2023.01) |
| *G06F 30/27* | (2020.01) |

(52) U.S. Cl.
CPC ......... *G06Q 10/067* (2013.01); *G06F 16/906* (2019.01); *G06F 30/27* (2020.01); *G06N 5/04* (2013.01)

(58) Field of Classification Search
CPC ..... G06Q 10/067; G06F 16/906; G06F 30/27; G06N 5/04
See application file for complete search history.

(56) References Cited

U.S. PATENT DOCUMENTS

| | | | |
|---|---|---|---|
| 10,339,164 B2* | 7/2019 | Obitko | G06F 16/27 |
| 2021/0209159 A1* | 7/2021 | Mahanta | G06N 20/00 |

* cited by examiner

*Primary Examiner* — Haoshian Shih
(74) *Attorney, Agent, or Firm* — Prol Intellectual Property Law, PLLC; H. Kenneth Prol

(57) ABSTRACT

A system and method of operating an integration application management system comprising a processor executing code instructions for modelling, via a graphical user interface (GUI), a business integration process including a data mapping type visual element and a universal data type mapping pipeline system to classify first application input data via a classification module having a machine learning classifier to determine data classifications in the first application input data and to select, via an inference module, among a plurality of neural network mapping algorithms corresponding to each of the one or more data classifications. The system and method to generate, with the selected neural network mapping algorithm, and present to a user a plurality of sample data mappings for the data mapping type visual element from a first application to a second application in the business integration process.

20 Claims, 8 Drawing Sheets

SYSTEM AND METHOD FOR UNIVERSAL MAPPING OF STRUCTURED, SEMI-STRUCTURED, AND UNSTRUCTURED DATA FOR APPLICATION MIGRATION IN INTEGRATION PROCESSES

FIELD OF THE DISCLOSURE

The present disclosure relates generally to a system and method for deploying and executing application migration solutions with data mapping such as part of data integration processes. More specifically, the present disclosure relates to providing universal data type mapping as part of application migration to accommodate structured, semi-structured, and unstructured data types or other classes of data types during an application migration from one execution environment to another execution environment for development of a visually modeled integration process.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, medical information processing, enterprise data storage, or global communications. In addition, information handling systems may include a variety of hardware and software components that may be configured to process, store, and communicate information and may include one or more computer systems, data storage systems, and networking systems.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), a head-mounted display device, server (e.g., blade server or rack server), a network storage device, a network storage device, a switch router or other network communication device, other consumer electronic devices, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components. Further, the information handling system may include telecommunication, network communication, and video communication capabilities and require communication among a variety of data formats. In some circumstances, migration of data or applications is necessary to conduct seamlessly integrated management of data across operational environments that may be networked or may need to operate in conjunction. Some diverse environments may include migration between cloud environments and localized enterprise environments, for example, and differences require data mapping which may be time consuming, costly, or difficult when formats and other aspects differ.

BRIEF DESCRIPTION OF THE DRAWINGS

The present disclosure will now be described by way of example with reference to the following drawings in which.

The use of the same reference symbols in different drawings may indicate similar or identical items.

DETAILED DESCRIPTION

Figure 1:
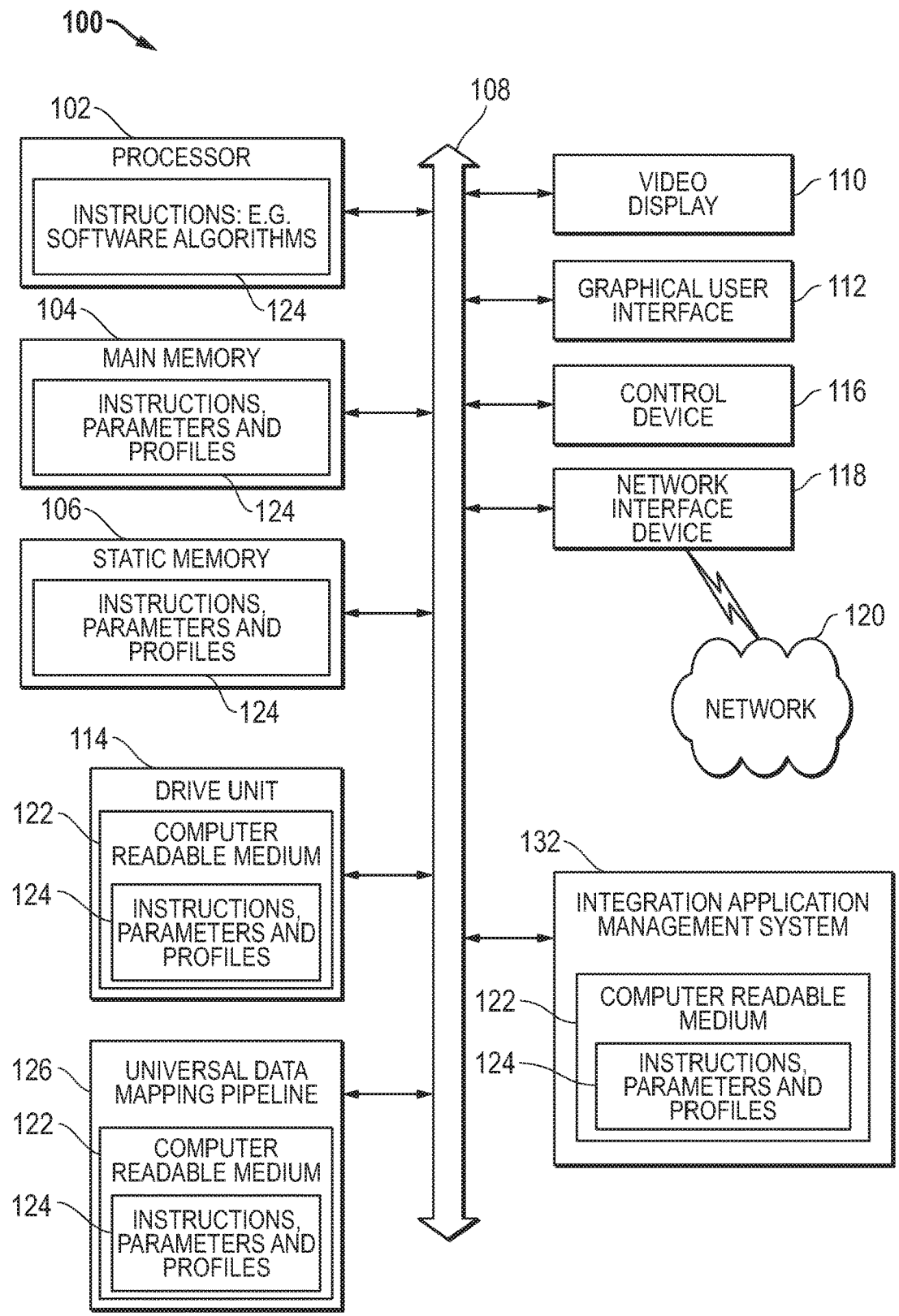
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Current methods of transacting business between or among a plurality of business entities involve the use of multiple software applications, application programming interfaces (APIs), or integration processes to transfer shared data among the plurality of businesses. Each of these business entities may use a different structure or method for receiving and storing the same type of information, causing each of these multiple applications, APIs, or integration processes to be customized to a particular business or group of businesses among which the same data may be shared. Embodiments of the present disclosure allow businesses to perform such necessary customization using an integration process modeling graphical user interface (GUI) that allows a user to model each step of the data sharing among the various businesses, using visual icons representing units of work to be performed within the integration process. An integration application management system managing such an integration process modeling GUI in embodiments described herein may generate the code instructions for performing this necessary customization of an integration process for a particular user's needs, and transmit these code instructions, along with a runtime engine for remote execution of those code instructions to an enterprise user's local network. Part of such customization of an integration process modeling may require mapping of data from between an input or source application to a target application data format. This process may require a developer to utilize previously mapped data formats or to manually apply or modify mapping between one or more input applications to one or more target applications within an enterprise or outside of an enterprise in a business integration process. In such a way, users may customize integration processes using the visual elements, including a data mapping type integration element, without having to learn the underlying computer language that will execute these steps.

Hundreds, or even thousands of individual business or users may customize their particular integration processes using these visual elements and the integration process modeling GUI described directly above. The ways in which each business customizes their individual integration processes using these visual elements may provide information useful in understanding, anticipating, and addressing these businesses' needs. For example, a business may customize its integration processes to rely heavily on the data mapping type visual element to track a multitude of different names that the business' trading partners use to describe a single type of data (e.g., "diagnosis," "ICD-9," "ICD9," "med_history," "chart," etc., each used to describe medical history of a patient). This heavy reliance on tracking a multitude of names for the same type of data may create a complex problem for mapping data for businesses that transact data in various industries. This may be compounded by complex nature of some business integration processes where modeling may require a time consuming or labor intensive mapping effort for developers customizing data mapping type visual elements even within a GUI based integration modeling software such as an integration application management system.

Since data mapping is crucial to what may be several parts of business integration process modeling via systems such as a GUI based integration application management system, an intelligent data mapping pipeline to automate the mapping function according to embodiments of the present disclosure may be useful to provide candidate mappings for data between source input data from an input application type to a target application within the business integration process. In embodiments herein, a supervised machine learning system such as those that operate like neural network encoder/decoder systems may be used to match data sets between an input application and a target application to provide one or more suggestions of sample data mappings to a user such as a developer of business integration processes. These neural network encoder/decoder systems may be referred to as neural network mapping algorithms within an inference module operating in a universal mapping data mapping pipeline described according to embodiments of the present disclosure.

However, input data may include a plurality of data types that exist as structured data, unstructured data, or semi-structured data that is used or operated upon by a source or input application to a business integration process. Additionally, subclasses of data types within structured data, unstructured data, or semi-structured data may also exist. Thus, input data to a business integration process from a first application may include variable data types. For example, a column of input data may include data that must be stored in an unstructured way such as textblobs, image data, video data or other types of data of a certain object. However, mapping that data requires plural data mapping models within a data mapping neural network mapping algorithm or algorithms that can infer correct mappings despite the varied data types. However, not all neural network mapping algorithms are optimal as between various types of structured, unstructured, or semi-structured data for creating data mapping models to provide accurately inferred sample data mappings to a developer. Thus, it can be a problem to apply the same neural network mapping algorithm to all input data from an input application.

Accordingly, the universal data mapping pipeline of embodiments of the present disclosure is proposed to include a data classification module to leverage the power of deep machine learning systems to detect data classification types to be input to a business integration process. The classification module may implement a machine learning classifier for example by detecting the types of data in the input application data from potentially large scale amounts of data. In some embodiments, input data may be sampled and column identification data, such as metadata, may be input into a machine learning classifier of a data classification module. For example, input data may be determined to contain multiple columns or rows of data as source input data which may contain different types of data. With the classification of data types, particularized inference data mapping neural network algorithms or other particularized data models may be implemented to infer one or more sample data maps for use with a data mapping type visual element. Sample data and column identification data may be input into the machine learning classifier to identify classes of data before an inference module matches mapping between data for a first source input application and a target application for a business process integration. Structured data, unstructured data, and semi-structured data types, or other data type subclasses may then be optimally treated in the inference module with different mapping neural network algorithms or other mapping machine learning models in some embodiments. Further, unstructured data may have different subclasses that are better suited to differing mapping neural network algorithm models or other machine learning mapping models. Similarly, different classes may exist within semi-structured data or structured data types that may be correlated with different intelligent mapping models to predict more accurately suggested, candidate mappings to a user. In such a scenario, a classification module may operate with an inference module in example embodiments to provide for a universal mapping pipeline in embodiments herein. The universal mapping pipeline may provide one or more sample candidate mappings and accommodate unstructured input data, semi-structured input data, structured input data or other data classifications for use with mapping type visual elements during development of business integrations.

FIG. 1 is a block diagram illustrating an information handling system, according to an embodiment of the present disclosure. Information handling system 100 can include processing resources for executing machine-executable code, such as a central processing unit (CPU), a programmable logic array (PLA), an embedded device such as a System-on-a-Chip (SoC), or other control logic hardware used in an information handling system several examples of which are described herein. Information handling system 100 can also include one or more computer-readable media for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

FIG. 1 illustrates an information handling system 100 similar to information handling systems according to several aspects of the present disclosure. For example, an information handling system 100 may be any mobile or other computing device capable of executing a set of instructions (sequential or otherwise) that specify actions to be taken by that machine. In a particular embodiment, the information handling system 100 can be implemented using electronic devices that provide voice, video, or data communication. Further, while a single information handling system 100 is illustrated, the term "system" shall also be taken to include any collection of systems or sub-systems that individually or jointly execute a set, or multiple sets, of instructions to perform one or more computer functions.

Information handling system 100 can include devices or modules that embody one or more of the devices or execute instructions for the one or more systems and modules herein, and operates to perform one or more of the methods. The information handling system 100 may execute code 124 for the integration application management system 132, universal data mapping pipeline 126 for structure, unstructured, or semi-structured data, or execute a business data integration process. These may operate on servers or systems, remote data centers, or on-box in individual client information handling systems such as a local display device, or a remote display device, according to various embodiments herein. The integration application management system 132 in an embodiment may operate to manage an integration process modelling graphical user interface (GUI) users may employ to model various tasks within a business data integration process by a variety of visual elements. The universal data mapping pipeline 126 for structured, unstructured, or semi-structured data, as well as any subclasses of data types may operate with a classifier module and an inference module according to embodiments herein. The data classifier module is used to classify input data types and select data mapping neural network algorithms suited for detected data classifications. The inference module may be used to generate suggested data mappings with improved accuracy according to data types using selected data mapping neural network algorithms suited to one or more detected data types. The suggested data mappings may be provided to a developer of a business integration via suggested customization of data mapping type visual elements used to model business data integration processes in the integration application management system 132. In some embodiments, it is understood any or all portions of code 124 for the universal data mapping pipeline 126, the integration application management system 132, or the business data integration process may operate on a plurality of information handling systems 100. Moreover, the universal data mapping pipeline 126 may in some embodiments be part of the integration application management system 132 or may be a resource or utility accessed by the integration application management system.

The information handling system 100 may include a processor 102 such as a central processing unit (CPU), a graphics-processing unit (GPU), control logic or some combination of the same. Any of the processing resources may operate to execute code that is either firmware or software code. Moreover, the information handling system 100 can include memory such as main memory 104, static memory 106, drive unit 114, or the computer readable medium 122 of the universal data mapping pipeline 126, or the integration application management system 132 (volatile (e.g. random-access memory, etc.), nonvolatile (read-only memory, flash memory etc.) or any combination thereof). Additional components of the information handling system can include one or more storage devices such as static memory 106, drive unit 114, and the computer readable medium 122 of the universal data mapping pipeline 126, or the integration application management system 132. The information handling system 100 can also include one or more buses 108 operable to transmit communications between the various hardware components such as any combination of various input and output (I/O) devices. Portions of an information handling system may themselves be considered information handling systems.

As shown, the information handling system 100 may further include a video display 110, such as a liquid crystal display (LCD), an organic light emitting diode (OLED), a flat panel display, a solid state display, or other display device. Additionally, the information handling system 100 may include a control device 116, such as an alpha numeric control device, a keyboard, a mouse, touchpad, camera, fingerprint scanner, retinal scanner, face recognition device, voice recognition device, or gesture or touch screen input.

The information handling system 100 may further include an integration process modelling graphical user interface (GUI) 112. The integration process modelling graphical user interface 112 in an embodiment may provide a visual designer environment permitting a user to define process flows between applications/systems, such as between trading partner and enterprise systems, and to model a customized business integration process to interface with and utilize the integration application management system 132. The graphical user interface 112 in an embodiment may provide a menu of pre-defined user-selectable visual elements, such as a mapping type visual element, and permit the user to arrange them as appropriate to model a process and may be displayed on the video display 110. The elements may include visual, drag-and-drop icons representing specific units of work required as part of the integration process, such as invoking an application-specific connector, transforming data from one format to another, routing data down multiple paths of execution by examining the contents of the data, business logic validation of the data being processed, mapping of data between differing application environments, etc.

The integration application management system 132 in an embodiment may generate code instructions for executing the integration process modeled by each of these visual elements in an embodiment. The universal data mapping pipeline 126 in an embodiment determine classes of input data to be mapped from a first application via a machine learning classifier or other supervised learning algorithm and may determine a data mapping neural network algorithm for each class of data detected. The universal data mapping pipeline is thus capable of intelligent determination of candidate mappings between diverse applications from different application environments. These candidate mappings may be provided as mapping options for customization of a mapping type visual element for an integration process modelling. The universal data mapping pipeline 126 may further gather candidate mapping selection, non-selection, modification, or user-generated mapping data and utilize that to further train and refine the classification and candidate mapping generation via data mapping neural network algorithms. Optional candidate mappings may be presented for the mapping type visual elements via the integration process modeling GUI 112 and feedback data on user selection, non-selection, modification, or customization may be received via GUI 112 as well.

Further, the graphical user interface 112 allows the user to provide user input to the integration application management system 132 providing information relating to trading partners, activities, enterprise applications, enterprise system attributes, and/or process attributes that are unique to a specific enterprise end-to-end business integration process during the business integration process modeling. For example, the graphical user interface 112 may provide drop down or other user-selectable menu options for identifying trading partners, application connector and process attributes/parameters/settings, etc., and dialog boxes permitting textual entries by the user, such as to describe the format and layout of a particular data set to be sent or received, for example, a Purchase Order. Similarly, GUI 112 may present one or more determined candidate mappings for between data from an input application to a target application within a business integration process. GUI 112 may also provide tools and an environment presenting data field from an input data set of the input application for manual mapping or customization of mapping to data fields for the data to be used with the target application.

The information handling system 100 can represent a server device whose resources can be shared by multiple client devices, or it can represent an individual client device, such as a desktop personal computer, a laptop computer, a tablet computer, or a mobile phone. In a networked deployment, the information handling system 100 may operate in the capacity of a server or as a client user computer in a server-client user network environment, or as a peer computer system in a peer-to-peer (or distributed) network environment.

The information handling system 100 can include a set of instructions 124 that can be executed to cause the computer system to perform any one or more of the methods or computer based functions disclosed herein. For example, information handling system 100 includes one or more application programs 124, and Basic Input/Output System and Firmware (BIOS/FW) code 124. BIOS/FW code 124 functions to initialize information handling system 100 on power up, to launch an operating system, and to manage input and output interactions between the operating system and the other elements of information handling system 100. In a particular embodiment, BIOS/FW code 124 reside in memory 104, and include machine-executable code that is executed by processor 102 to perform various functions of information handling system 100. In another embodiment (not illustrated), application programs and BIOS/FW code reside in another storage medium of information handling system 100. For example, application programs and BIOS/FW code can reside in static memory 106, drive 114, in a ROM (not illustrated) associated with information handling system 100 or other memory. Other options include application programs and BIOS/FW code sourced from remote locations, for example via a hypervisor or other system, that may be associated with various devices of information handling system 100 partially in memory 104, storage system 106, drive unit 114 or in a storage system (not illustrated) associated with network interface device 118 or any combination thereof. Application programs 124, and BIOS/FW code 124 can each be implemented as single programs, or as separate programs carrying out the various features as described herein. Application program interfaces (APIs) such as WinAPIs (e.g. Win32, Win32s, Win64, and WinCE), proprietary APIs (e.g., for SalesForce® or Oracle's® NetSuite), or an API adhering to a known open source specification (e.g., Swagger™) may enable application programs 124 to interact or integrate operations with one another.

In an example of the present disclosure, instructions 124 may execute software for determining users' preferences for certain sub-processes within modeled integration processes, and for placing users with similar preferences in contact with one another. The computer system 100 may operate as a standalone device or may be connected, such as via a network, to other computer systems or peripheral devices.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The static memory 106, disk drive unit 114, and the universal data mapping pipeline 126, or the integration application management system 132 may include a computer-readable medium 122 such as a magnetic disk, or a solid-state disk in an example embodiment. The computer-readable medium of the memory 104, storage devices 106 and 114, the universal data mapping pipeline 126, or the integration application management system 132 may store one or more sets of instructions 124, such as software code corresponding to the present disclosure.

The disk drive unit 114, static memory 106, and computer readable medium 122 of the integration application management system 132 also contain space for data storage such as an information handling system for managing locations of executions of customized integration processes in endpoint storage locations. Connector code sets, and trading partner code sets may also be stored in part in the disk drive unit 114, static memory 106, or computer readable medium 122 of the universal data mapping pipeline 126, or the integration application management system 132 in an embodiment. In other embodiments, data profile code sets, and run-time engines may also be stored in part or in full in the disk drive unit 114, static memory 106, or computer readable medium 122 of the universal data mapping pipeline 126, or the integration application management system 132. Further, the instructions 124 of the universal data mapping pipeline 126, or the integration application management system 132 may embody one or more of the methods or logic as described herein. The computer readable medium 122 of the universal data mapping pipeline 126 may maintain storage of column metadata or identification information as well as sample input data entries retrieved from input data sets from an input application to a business integration process. Further, the computer readable medium 122 of the universal data mapping pipeline 126 may also maintain other parameters from the business integration efforts including the target application and data fields. Finally, the computer readable medium 122 of the universal data mapping pipeline 126 may maintain the machine learning classifier of a classification module and one or more data mapping neural network algorithms for various classes of data and in various states of training according to embodiments herein.

In a particular embodiment, the instructions, parameters, and profiles 124, and the universal data mapping pipeline 126, or the integration application management system 132 may reside completely, or at least partially, within the main memory 104, the static memory 106, disk drive 114, and/or within the processor 102 during execution by the information handling system 100 which may reside at a service provider, at an enterprise client, in one or more cloud locations, or some combination of the above server locations. Software applications may be stored in static memory 106, disk drive 114, the universal data mapping pipeline 126, or the integration application management system 132.

Network interface device 118 represents a NIC disposed within information handling system 100, on a main circuit board of the information handling system, integrated onto another component such as processor 102, in another suitable location, or a combination thereof. The network interface device 118 can include another information handling system, a data storage system, another network, a grid management system, another suitable resource, or a combination thereof, and may communicate via a wired connection or wirelessly.

The universal data mapping pipeline 126, or the integration application management system 132 may also contain computer readable medium 122. While the computer-readable medium 122 is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the universal data mapping pipeline 126, or the integration application management system 132, which may be operably connected to the bus 108. The universal data mapping pipeline 126 is discussed in greater detail herein below.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, or module can include software, including firmware embedded at a device, such as an Intel® Core class processor, ARM® brand processors, Qualcomm® Snapdragon processors, or other processors and chipset, or other such device, or software capable of operating a relevant environment of the information handling system. The system, device or module can also include a combination of the foregoing examples of hardware or software. In an example embodiment, the universal data mapping pipeline 126, or the integration application management system 132 and the several modules described in the present disclosure may be embodied as hardware, software, firmware or some combination of the same. Note that an information handling system can include an integrated circuit or a board-level product having portions thereof that can also be any combination of hardware and software. Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Figure 2:
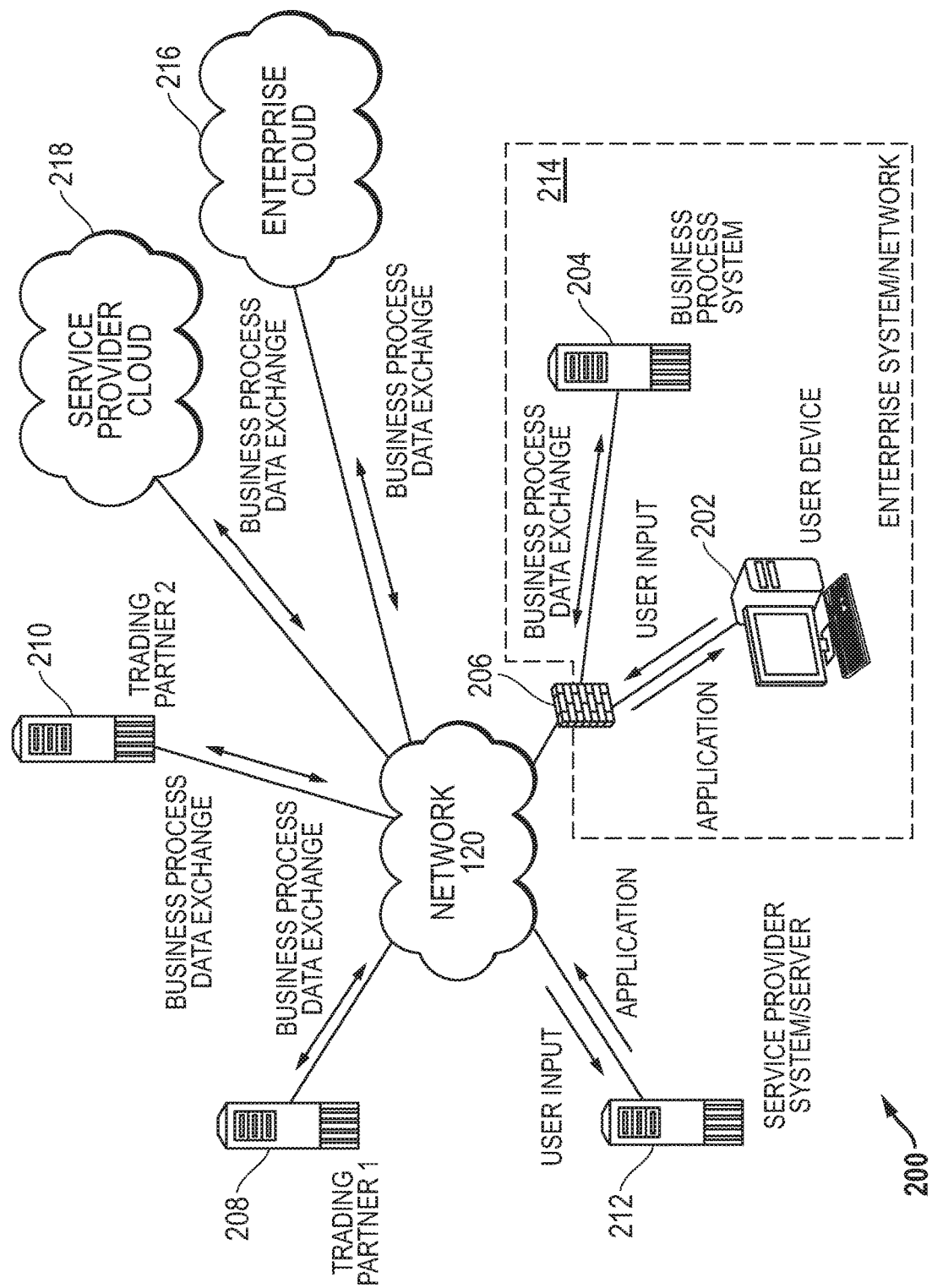
FIG. 2 is a block diagram illustrating a simplified integration network according to an embodiment of the present disclosure.

FIG. 2 is a graphical diagram illustrating a simplified integration network 200 including a service provider system/server 212 and an enterprise system/network 214 in an embodiment according to the present disclosure. Actual integration network topology could be more complex in some other embodiments. As shown in FIG. 2, an embodiment may include conventional computing hardware of a type typically found in client/server computing environments. More specifically, the integration network 200 in an embodiment may include a conventional user/client device 202, such as a conventional desktop or laptop PC, enabling a user to communicate via the network 120, such as the Internet. In another aspect of an embodiment, the user device 202 may include a portable computing device, such as a computing tablet, or a smart phone. The user device 202 in an embodiment may be configured with conventional web browser software, such as Google Chrome®, Firefox®, or Microsoft Corporation's Internet Explorer® for interacting with websites via the network 120. In an embodiment, the user device 202 may be positioned within an enterprise network 214 behind the enterprise network's firewall 206, which may be of a conventional type. As a further aspect of an embodiment, the enterprise network 214 may include a business process system 204, which may include conventional computer hardware and commercially available business process software such as QuickBooks, SalesForce's® Customer Relationship Management (CRM) Platform, Oracle's® Netsuite Enterprise Resource Planning (ERP) Platform, Infor's® Warehouse Management Software (WMS) Application, or many other types of databases.

Current methods of transacting business between or among a plurality of business entities involve the use of multiple software applications, application programming interfaces (APIs), or integration processes to transfer shared data among the plurality of businesses. In an embodiment, the integration network 200 may further include trading partners 208 and 210 operating conventional hardware and software for receiving and/or transmitting data relating to business-to-business transactions. For example, Walmart® may operate trading partner system 208 to allow for issuance of purchase orders to suppliers, such as the enterprise 214, and to receive invoices from suppliers, such as the enterprise 214, in electronic data form as part of electronic data exchange processes. Electronic data exchange process in an embodiment may include data exchange via the world wide web. In other embodiments, electronic data exchange processes may include data exchange via File Transfer Protocol (FTP) or Secure File Transfer Protocol (SFTP).

Each of these business entities may use a different structure or method for receiving and storing the same type of information, causing each of these multiple applications, APIs, or integration processes to be customized to a particular business or group of businesses among which the same data may be shared. Embodiments of the present disclosure allow businesses to perform such necessary customization using an integration process modeling graphical user interface (GUI) that allows a user to model each step of the data sharing among the various businesses, using visual icons representing units of work to be performed within the integration process. In an embodiment, a provider of a service ("service provider") for creating on-demand, real-time creation of customized data integration software applications may operate a service provider server/system 212 within the integration network 200. The service provider system/server 212 may be specially configured in an embodiment, and may be capable of communicating with devices in the enterprise network 214.

The service provider system/server 212 in an embodiment may host an integration process-modeling user interface in an embodiment. Such an integration process-modeling user interface may allow a user or the universal data matching pipeline of the present disclosure to model mapping between input data sets of an input application environment and a dataset that is able to be utilized by a target application in an integration process including one or more sub-processes for data integration through a business process data exchange between an enterprise system/network 214 and outside entities or between multiple applications operating at the business process system 204. The integration process modeled in the integration process-modeling user interface in an embodiment may be a single business process data exchange shown in FIG. 2, or may include several business process data exchanges shown in FIG. 2. For example, the enterprise system/network 214 may be involved in a business process data exchange via network 120 with a trading partner 1, and/or a trading partner 2. In other example embodiments, the enterprise system/network 214 may be involved in a business process data exchange via network 120 with a service provider located in the cloud 218, and/or an enterprise cloud location 216. For example, one or more applications between which a data set field value may be transferred, according to embodiments described herein, may be located remotely from the enterprise system 214, at a service provider cloud location 218, or an enterprise cloud location 216.

A user may access an integration process-modeling user interface in an embodiment to model one or more business process data exchanges via network 120 within an integration process by adding one or more integration process visual elements or code sets to an integration process flow. A data mapping type visual element may be used to map data between one or more input data sources from a first application environment to a target application environment. These integration process visual elements in an embodiment may model the ways in which a user wishes data to be accessed, moved, and/or manipulated during the one or more business process data exchanges. They may be customized or modified by a user for the specific needs of a modeled business process. In an embodiment, the universal data mapping pipeline may use intelligent algorithms in a classification module and an inference module to determine input data classes and generate candidate data mappings for a user. These may be presented to a user via the integration process-modeling graphical user interface.

An integration application management system managing such an integration process-modeling GUI in embodiments described herein may generate the code instructions for performing this necessary customization of an integration process for a particular user's needs, and transmit these code instructions, along with a runtime engine for remote execution of those code instructions to an enterprise user's local network. Each integration process visual element the user adds to the integration process flow diagram in an embodiment may be associated with a pre-defined subset of code instructions stored at the service provider systems/server 212 in an embodiment. Upon the user modeling the integration process, the service provide system/server 212 in an embodiment may generate a run-time engine capable of executing the pre-defined subsets of code instructions represented by the integration process visual elements chosen by the user. The runtime engine may then execute the subsets of code instructions in the order defined by the modeled flow of the integration process visual elements given in the integration process flow diagram. In such a way, an integration process may be executed without the user having to access, read, or write the code instructions of such an integration process.

In other aspects of an embodiment, a user may initiate a business process data exchange between one cloud service provider 218 and one cloud enterprise 216, between multiple cloud service providers 218 with which the enterprise system 214 has an account, or between multiple cloud enterprise accounts 216. For example, enterprise system 214 may have an account with multiple cloud-based service providers 218, including a cloud-based SalesForce® CRM account and a cloud-based Oracle® Netsuite account. In such an embodiment, the enterprise system 214 may initiate business process data exchanges between itself, the SalesForce® CRM service provider and the Oracle® Netsuite service provider.

Tens or even hundreds of input datasets from various input application environments of individual business or users may be input into a business integration processes. Using these visual elements and the integration process modeling GUI to custom enter mapping of each one to a target application within the business integration process can become time consuming and burdensome. The universal data mapping pipeline described herein may mitigate such effort by using intelligent algorithms to determine classes of data in input data sets and then utilize trained data mapping neural network algorithms to generate suggested candidate mappings for a user. Embodiments of the present disclosure address this issue by implementing a universal data mapping pipeline capable of identifying plural classes of data which may come from structured data, unstructured data, or semi-structured data and operate supervised learning systems via data mapping neural network algorithms suited to such identified data classes to generate accurate suggestions for data mappings to a user to make the customization of the mapping type visual elements simpler and more efficient when modeling a business integration process.

Figure 3:
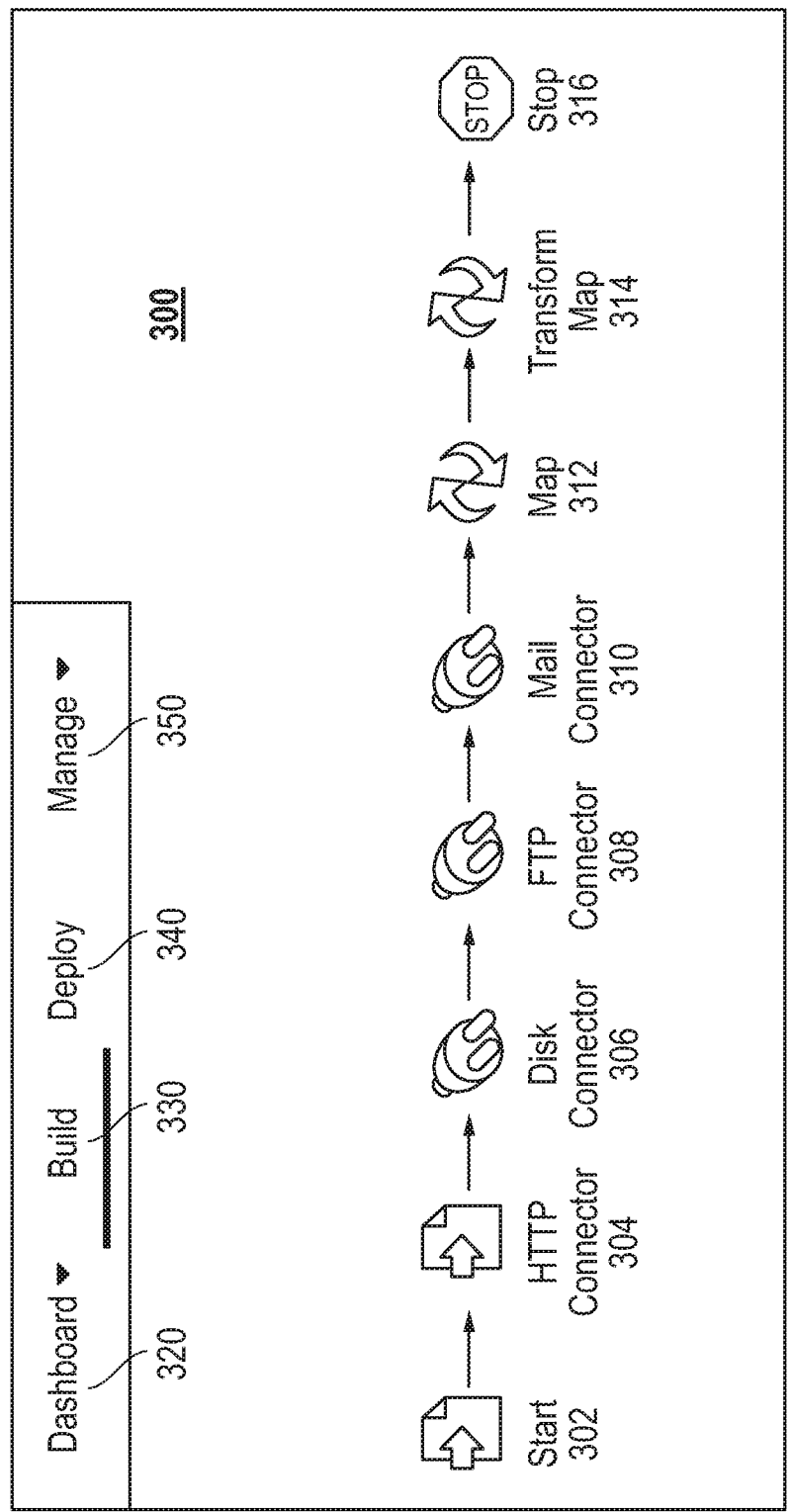
FIG. 3 is a graphical diagram illustrating a user-generated flow diagram of an integration process according to an embodiment of the present disclosure.

FIG. 3 is a graphical diagram illustrating a user-generated flow diagram of an integration process for exchange of electronic data records according to an embodiment of the present disclosure. The flow diagram in an embodiment may be displayed within a portion of a graphical user interface 300 that allows the user to build the process flow, deploy the integration process modeled thereby (e.g., by selecting the deploy tab 340), manage dataset field values manipulated by such an integration process (e.g., by selecting the manage tab 350), and to view high-level metrics associated with execution of such an integration process (e.g., by selecting the dashboard tab 320). The user may build the process flow and view previously built process flow diagrams by selecting the "Build" tab 330 in an embodiment, such as via a drop down menu in embodiments. A user may generate a flow diagram in an embodiment by providing a chronology of process-representing integration visual elements via the use of an integration process-modeling user interface. In some embodiments, the integration process-modeling user interface may take the form of a visual user interface. In such embodiments, the user-selectable visual elements representing integration sub-processes (e.g. connector integration elements) may be visual icons.

An integration process-modeling user interface in an embodiment may provide a design environment permitting a user to define process flows between applications/systems, such as between trading partner and enterprise systems, between on-site data centers and cloud-based storage modules, or between multiple applications, and to model a customized business integration process. Such an integration process-modeling user interface in an embodiment may provide a menu of pre-defined user-selectable elements representing integration sub-processes and permit the user or the data integration protection assistance system to arrange them as appropriate to model a full integration process. For example, in an embodiment in which the integration process-modeling user interface is a graphical user interface, the elements may include visual, drag-and-drop icons representing specific units of work (known as process components or shapes) required as part of the integration process. Such process components in an embodiment may include invoking an application-specific connector to access, and/or manipulate data. In other embodiments, process components may include tasks relating to transforming data from one format to another, routing data down multiple paths of execution by examining the contents of the data, mapping of data sets as between various application environments, business logic validation of the data being processed, among other operations.

Each process component as represented by integration sub-process icons or elements may be identifiable by a process component type, and may further include an action to be taken. For example, a process component may be identified as a "connector" component or a "shape" component. Each "connector" component, when chosen and added to the process flow in the integration process-modeling user interface, may allow a user to choose from different actions the "connector" component may be capable of taking on the data as it enters that process step. Further the integration-process modeling user interface in an embodiment may allow the user to choose the data set or data element upon which the action will be taken. The action and data element the user chooses may be associated with a connector code set, via the integration application management system, which may be pre-defined and stored at a system provider's memory in an embodiment.

In an embodiment, a user may choose a process component it uses often when interfacing with a specific trade partner or application, and define the parameters of that process component by providing parameter values specific to that trading partner or application. If the user wishes to use this process component, tailored for use with that specific trading partner or application repeatedly, the user may save that tailored process component as a trading partner or component named specifically for that application. For example, if the user often accesses NetSuite® or SalesForce®, the user may create a database connector process component, associated with a pre-built connector code set that may be used with any database, then tailor the database connector process component to specifically access NetSuite® or SalesForce® by adding process component parameters associated with one of these applications. If the user uses this process component in several different integration processes, the user may wish to save this process component for later use by saving it as a NetSuite® or SalesForce® process component. In the future, if the user wishes to use this component, the user may simply select the NetSuite® or SalesForce® component, rather than repeating the process of tailoring a generic database connector process component with the specific parameters defined above.

As shown in FIG. 3, process-representing visual elements may include a start element 302, a HyperText Transfer Protocol (HTTP) connector element 304, a disk connector element 306, a file transfer protocol (FTP) connector element 308, a mail connector element 310, and map element 312, a transform mapping type element 314, or a stop element 316. Other embodiments may also include a branch element, a decision element, a data process element, or a process call element, for example. Each of the connector elements 304, 306, 308, 310, and a start element 302 in an embodiment may represent a sub-process of an integration process describing the accessing and/or manipulation of data. The start element 302 in an embodiment may also operate as a connector element.

In an embodiment, a start element 302 may operate to begin a process flow, and a stop element 316 may operate to end a process flow. As discussed above, each visual element may require user input in order for a particular enterprise or trading partner to use the resulting process. The start element 302 in an embodiment may further allow or require the user to provide data attributes unique to the user's specific integration process, such as, for example, the source of incoming data to be integrated. For example, the user or the integration process user matching system may use a connector element to define a connection (e.g., an application managing data upon which action is to be taken), and the action to be taken. A user may use a start element 302 to further define a location of such data, according to the language and storage structure understood by the application managing such data.

Users may choose from various sub-types of connector visual elements in an embodiment. For example, an HTTP connector element 304 in an embodiment may operate to send or receive datasets to or from an HTTP-enabled server. The code set associated with HTTP connector element 304 in an embodiment may be written using basic HTTP commands, which may be easier to develop than developing a Simple Object Access Protocol (SOAP) specification for communication with such HTTP-enabled servers. As another example, a disk connector element 306 in an embodiment may operate to read and write data sets from an underlying file system of the host machine in the user's enterprise network. Such datasets may be sent to directories on any disk to which the host machine has access, which may include trading partner's networks or machines, if such remote locations have granted the host machine Virtual Private Network (VPN) access. In another example, an FTP connector element 308 in an embodiment may operate to download or upload files to an FTP-enabled server. Such a connector may access any FTP server connected to the internet, and may offer a viable alternative to a traditional Value Added Network (VAN), because there are no ongoing document fees when exchanging data via internet-based FTP. In yet another example, a mail connector element 310 may operate to read email from a Post Office Protocol (POP) email server and send email to a Simple Mail Transfer Protocol (SMTP) mail server in an embodiment.

A map element 312, also referred to as a mapping type element, may be used to transform data from one format to another. For example, a mapping type element 312 in an embodiment may be used to convert a character to uppercase, change the format of a date or look up a value in a database. A transform map element 314, may be another mapping type element, in an embodiment may associate a first data set field name for a data set field value being retrieved from a first application or source with a second data set field name under which that data set field value will be stored at a second application or destination.

The visual icons may be managed and customized via the graphical user interface 300 as well. For example, the mapping type visual element 312 or 314 may be customized to allow a user to build a mapping between one or more input data sets of an input application environment, for example from a trading partner server system, to a target application environment data set format that may be within an enterprise or external to the enterprise depending on the business integration process being modeled. In embodiments of the present disclosure, the universal data mapping pipeline may be invoked to determine classes of data from the input data sets and generate one or more suggested candidate data mappings to a user. These suggested mappings may be presented upon customization of the mapping type visual element 312 or 314 via the graphical user interface 300. This graphical user interface 300 may be monitored by an interaction module of the universal data mapping pipeline of embodiments herein to provide candidate mappings and record user selections or actions with respect to those candidate mappings. The user may select among candidate mappings, modify those suggested data mappings, or provide a custom user-generated data mapping. The selection, modification, or custom user generated mapping actions of a user may be recorded and data of these selections or non-selections may be fed back to the universal data mapping pipeline in various embodiments. The user feedback data may be used by the universal data mapping pipeline to further train the supervised machine learning classifier of a data classification module as well as the data mapping neural network algorithms or other algorithms used in the inference module. In this way, the universal data mapping pipeline may be continually updated with respect to mapping efforts between varying input and target application environments and data types to improve accuracy of suggested candidate mappings generated. The stop element 316 in an embodiment may operate to terminate the integration process.

The integration application management system in an embodiment may associate each of the visual elements within the integration process-modeling graphical user interface with a set of code instructions written in a machine-readable, executable format. For example, the integration application management system in an embodiment may associate the start element 302 with a connector code set, written in a human-readable, machine-executable code language (e.g., JavaScript Object Notation (JSON) or Extensible Markup Language (XML)), that includes code instructions for accessing a data set field value associated with a user-specified data set field name defined within the start element 302. In other aspects of an embodiment, the data set field name may be defined within the start element 302 in such an embodiment through execution of a software query, written in a specific query syntax or language (e.g., SQL or NoSQL) by the integration process user matching system. Upon generation and storage within a memory of each of the code sets associated with each of the visual elements within the integration process-modeling graphical user interface 300 in an embodiment, the integration application management system may further generate a runtime engine capable of executing each of these code sets. The integration application management system in an embodiment may transmit the runtime engine and each of the code sets for execution of the integration process modeled by the user via the integration process-modeling graphical user interface for execution of the integration process at a remote location (e.g., behind the firewall of a user's enterprise system/network).

In such a way, users of the integration process modeling GUI 300 may customize their integration processes by modeling them with these visual elements. Such a modeling process may negate a need for the user to learn the underlying computer language in which the integration process code instructions are actually written. Further, the ways in which each business customizes their individual integration processes using these visual elements and the integration process modeling GUI 300 may provide information useful in understanding, anticipating, and addressing these businesses' needs. For example, a business may customize its integration processes to rely heavily on a mapping visual element to track a multitude of different names that the business' trading partners use to describe a single type of data (e.g., "diagnosis," "ICD-9," "ICD9," "med_history," "chart," etc., each used to describe medical history of a patient). This heavy reliance on tracking a multitude of names for the same type of data may find suggested candidate mapping generated via the universal data mapping pipeline of embodiments of the present disclosure to provide substantial efficiencies in modeling business integration processes with the integration application management system and GUI 300.

Figure 4:
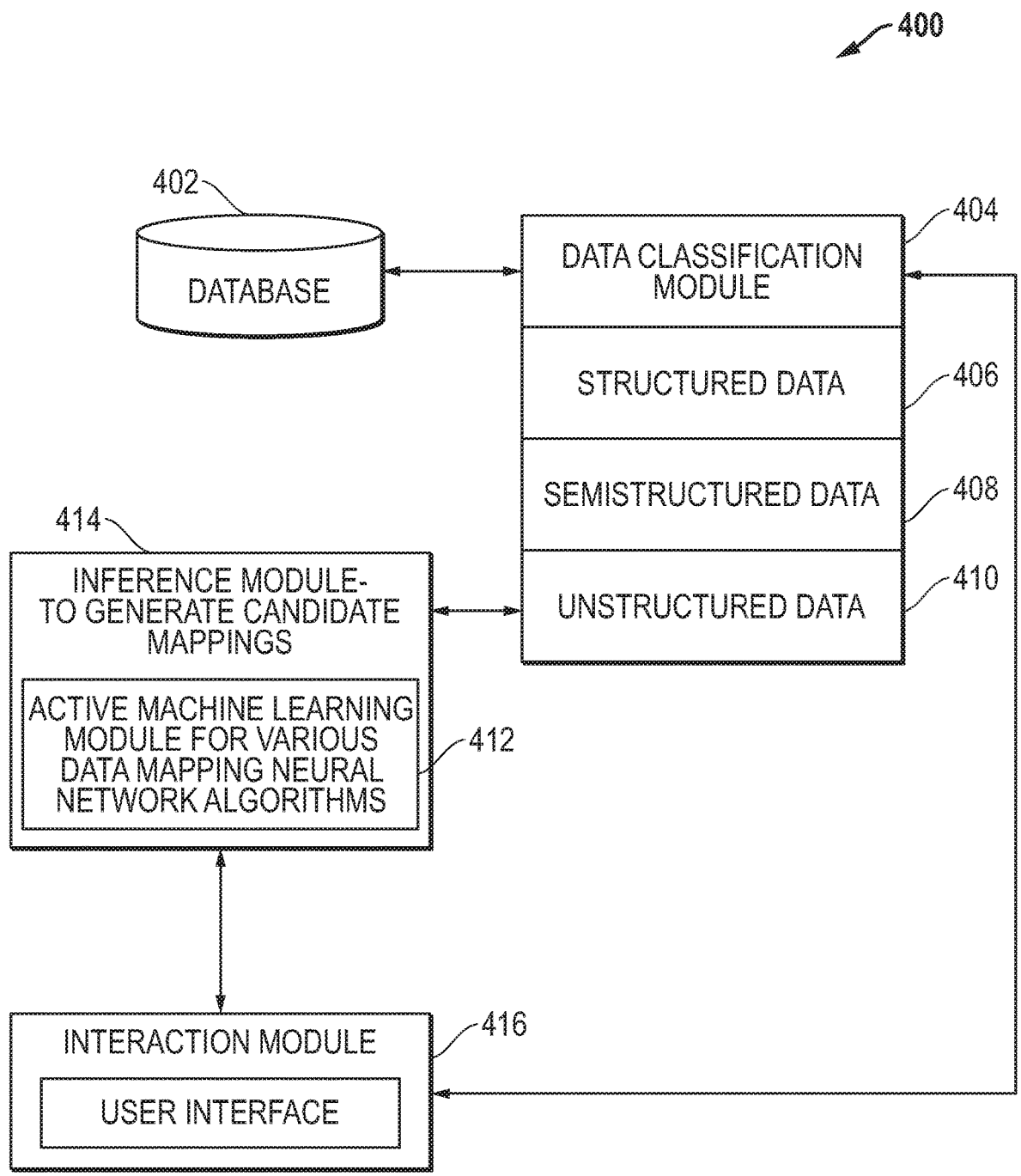
FIG. 4 is a block diagram illustrating of a universal data mapping pipeline managing structured and unstructured data according to an embodiment of the present disclosure.

FIG. 4 is a block diagram illustrating a universal data mapping pipeline 400 according to an embodiment of the present disclosure. The integration application management system in an embodiment may be used to prepare mapping between one or more input application environments and a target application environment during the course of a modeled business integration process. In an embodiment, as a first step in customizing the mapping, a user may be presented with one or more generated candidate mappings to facilitate the customization of a mapping type visual element in modeling a business integration process via the integration application management system GUI that is supported by an interaction module 416. The universal data mapping pipeline 400 may implement a data classification module 404 utilizing a machine learning classifier or other supervised learning for determining data classifications. The universal data mapping pipeline 400 may implement an inference module 414 for generating potential candidate mappings based one or more matched data mapping neural network algorithm models.

The universal data mapping pipeline 400 may begin with a data classification module 404 receiving input dataset column information identifying or labelling columns or rows of the input data sets in an embodiment. The column identifying information may be in the form of column or row metadata from the input dataset. Further, the universal data mapping pipeline 400 may take sample data from various types or entries of data from an input dataset in an embodiment. The universal data mapping pipeline 400 may receive column identifying data or sample data from one or more databases 402 that store the intended input dataset. Database 402 may reside outside of the universal data mapping pipeline 400 or the integration application management system in some embodiments. For example, the input dataset stored at database (s) 402 may operate in an input application environment at a trading partner server system or in a cloud system location in an embodiment. In some embodiments, access to this input dataset may be directly with a server system hosting an input application environment. In other embodiments, the integration application management system may access the input dataset and the column identifying data, the sample column data, or other information inputs from the input dataset may be forwarded to the universal data mapping pipeline 400. For example, information identifying the input application environment of the input dataset may be used, information identifying the target application environment or columns identifiers of a target dataset may be used, or any information on data hierarchies, if any, from input application datasets or target application datasets may be received at a universal data mapping pipeline 400.

The column identifying information or input dataset sampled data may be taken in by the data classification module 404. The data classification module 404 may execute a machine learning classifier to identify one or more classes of data to be detected in the input dataset. The column identifying information or input dataset sampled data information about the input application may all be input parameters to the machine learning classifier of the data classification module 404. Other input parameters to the machine learning classifier may include information identifying the input application environment of the input dataset may be used, information identifying the target application environment or columns identifiers of a target dataset may be used, or any information on data hierarchies, if any, from input application datasets or target application datasets. It is appreciated that yet other inputs including user feedback as described or previously conducted classifications of data as comparison may be used with a machine learning classifier in embodiments herein. An example machine learning classifier that may be utilized includes a convolutional neural network (CNN) for images and recurrent neural networks (RNN) for time-series data. Other supervised learning systems may also be used, such as support vector machine (SVM) machine learning algorithms or hidden Markov model (HMM) supervised learning algorithms applied to sequential or time-series data for example.

The data classification module may determine among the types of data classes detected in the input data set to the business integration process. For example, one or more types of structured data 406 may be detected by the machine learning classifier. This structured data classification 406 may be determined from column metadata or column sample data, as well as other information received about the input data set.

Structured data classification 406 may also be a classification to be matched with one or more types of data mapping neural network algorithms suited to this type of data class or types of data classes detected in the input dataset. For example, there may be multiple classes of structured data 406 in some embodiments. In such embodiments, the data classification module 404 may match each type of structured data 406 with a type of data mapping neural network algorithm suited to the type of data class detected, Example types of data mapping neural network algorithms for use with structured data 406 may include CNN algorithm for images and long/short term memory (LTSM) neural network algorithm for time-series data.

Semi-structured data classification 408 may also be a classification to be matched with a type of data mapping neural network algorithm suited to the type of data class detected in the input dataset. The primary difference between structured data and semi-structured data, is that structured data is a single level of object hierarchy while semi-structured is multi-level object hierarchy. In some embodiments, there may be multiple classes of semi-structured data 408 in some embodiments. For example, the data classification module 404 may match each type of semi-structured data 408 with a type of data mapping neural network algorithm suited to this type of data class or types of data classes detected, Example types of data mapping neural network algorithms for use with semi-structured data 408 may include neural machine translation (NMT) used with an underlying neural network architecture as an example type of neural network algorithm or combination or algorithms. For example, semi-structured data comprising JSON files or XML files, may be suited to a data mapping neural network algorithm including NMT as it still helps maintain a left to right object hierarchy. Thus, this problem may between object hierarchy of semi-structured data may be formulated as similar to a language translation.

Unstructured data classification 410 may be a classification to be matched with a one or more types of data mapping neural network algorithms suited to the type of data class or classes detected in the input dataset. For example, there may be multiple classes of unstructured data 410 in some embodiments. In such embodiments, the data classification module 404 may match each type of unstructured data 410 with the type of data mapping neural network algorithm suited to the type of data class or classes detected. Example types of data mapping neural network algorithms for use with unstructured data 410 may include a word2vec neural network algorithm or a doc2vec neural network algorithm that manage word semantics for example. For example, unstructured data comprising text blobs, images, videos may be suited to a data mapping neural network algorithm such as encoder decoder architecture neural network. Such a data mapping neural network algorithm may be suited for assessing candidate mappings of text blobs unstructured data because they capture the meaning of the words in text blobs (context of the words used) for example. In another example, images unstructured data may be matched with a R-CNN based neural network algorithm. This data mapping neural network algorithm may be suited for assessing candidate mappings of images/blobs/time-series unstructured data and selected due to specific suitability of those neural network algorithms because they support object segmentations.

Once one or more data classifications have been determined from the input dataset and matched to a data mapping neural network algorithm according to the data classification module 404, the inference module 414 may implement the matched data mapping neural network algorithm to generate one or more candidate mappings for the business integration process being modeled. In an embodiment, the inference module 414 may access an active machine learning module 412 which may be part of the inference module 414 or may be remotely located. The active machine learning module 412 may make one or more of a plurality of data mapping neural network algorithms available in example embodiments. For example, the data mapping neural network algorithms such as a CNN algorithm, an LTSM neural network algorithm, an RNN, and SVM, an HMM, NMT translation functions, Word2Vec, or doc2vec neural network algorithms may be implemented by the active machine learning module 412 of the inference module 414 to generate candidate mappings.

Upon generation of the one or more candidate mappings to map input datasets from an input application environment to a target dataset for the target application environment by the inference module 414, the universal data mapping pipeline 400 may provide the candidate mappings to a user. The user may be presented candidate mappings via an interaction module 416 having a user interface for developing mappings in a mapping-type visual element as part of the integration application management system GUI for developing the modeled business integration processes. Selections, non-selections, modifications, or user generated mappings by the user may be recorded as mapping feedback information by the interaction module 416. This mapping feedback information may be sent to the active machine learning module 412 to further train or modify the data mapping neural network algorithms of the inference module 414 in some embodiments. The mapping feedback information may be sent to the data classification module 412 to further train or modify the machine learning classifier or other supervised learning system for detecting data classifications from input datasets in some embodiments.

Figure 5A:
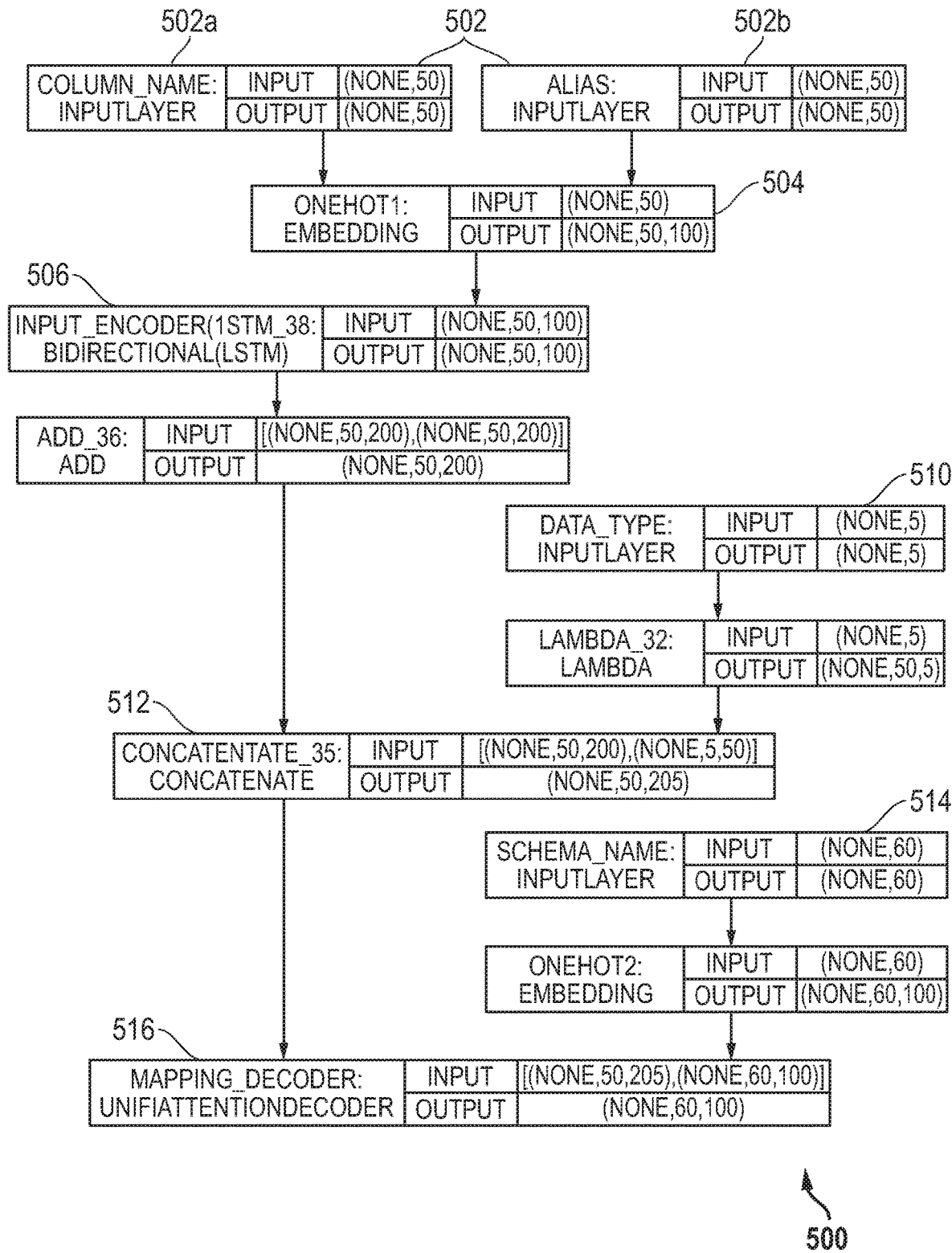
FIG. 5A is a block diagram illustrating a data mapping neural network algorithm model operating under the universal data mapping pipeline according to an embodiment of the present disclosure.

FIG. 5A is a schematic representation 500 illustrating operation of a data mapping neural network algorithm of an inference module for the universal data mapping pipeline of an embodiment of the present disclosure. In this example embodiment of FIG. 5A, the inference module conducts mapping of a column with a node by generating a vector of column metadata 502, in accordance with an exemplary embodiment of the present disclosure. This is just one of several possible data mapping neural network systems that may be applied depending on the determined data classifications detected in input data from an input application environment. In this example, column metadata 502 may be received from input dataset and input into the data mapping neural network algorithm. The column metadata 502 may comprise data such as column name and aliases such as shown at 502a and 502b respectively. The column name 502a and alias 502b are encoded into a vector 504 in the example embodiment which may work to assign meaning vectors to words or phrases in column names 502a and alias 502b information received about columns of input datasets. An encoder/decoder data mapping neural network algorithm format may be used. An encoder step 506 may invoke a matched data mapping neural network algorithm. For example, the coder step 506 may invoke a bidirectional LTSM neural network algorithm in one example embodiment. Other selected data mapping neural network algorithms may be invoked depending upon the class of data type detected by a data classification module.

The encoder step 506 may convert one or more input objects, such as the column name information and column alias information as input and convert these into the feature domain as an encoded vector 504. In an example embodiment, several models may have been built for the data mapping neural network algorithm, such as for datatypes, column names, or samples of actual column data.

Figure 5B:
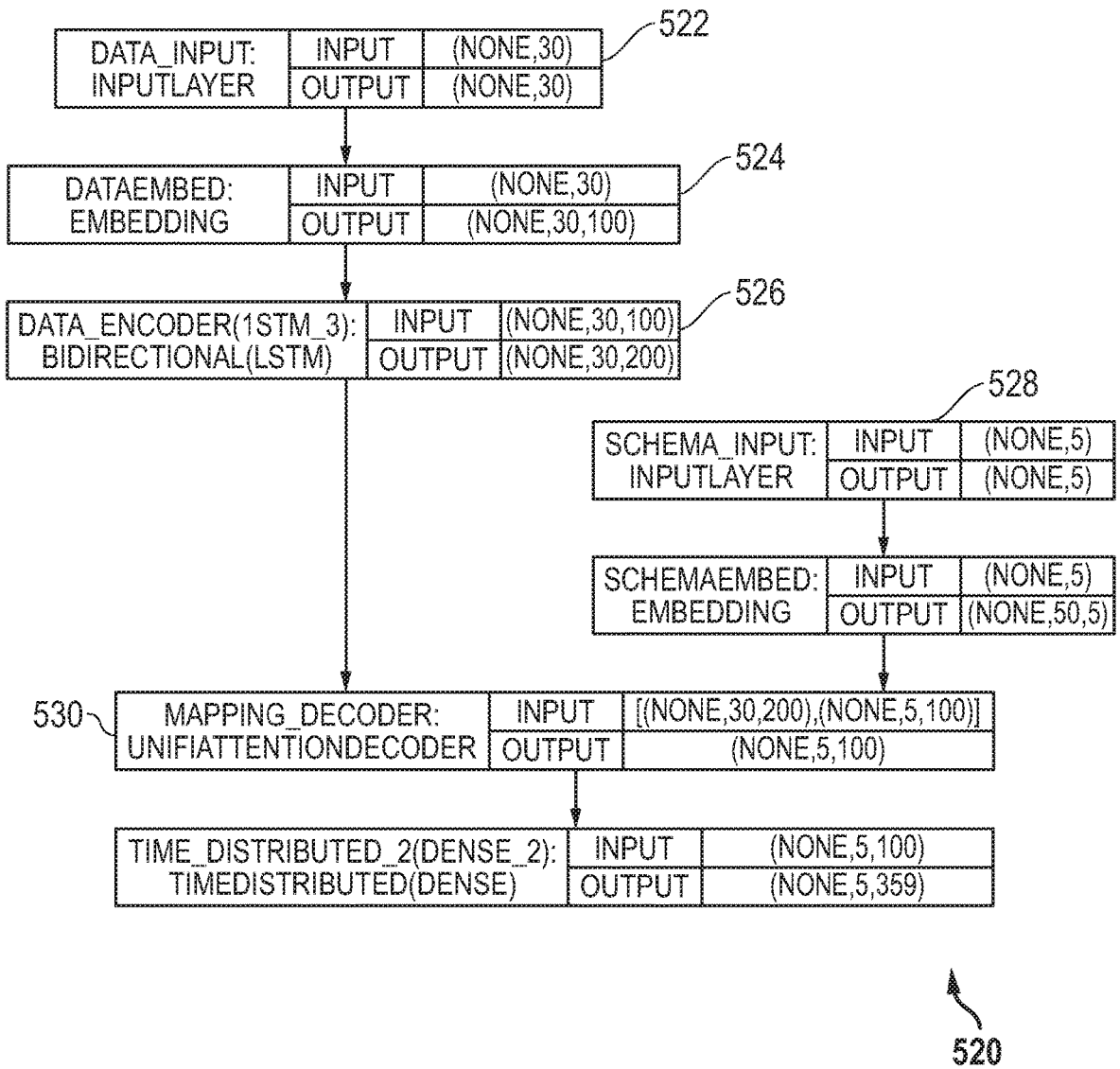
FIG. 5B is a block diagram illustrating a data mapping neural network algorithm model operating under the universal data mapping pipeline according to another embodiment of the present disclosure.

An inference phase may utilize a Beam search technique that may be utilized to infer top probable schema at each step of iteration for matching input dataset fields with target dataset fields. Multiple models may be utilized to generate predictions for mapping vectors representing input dataset columns from column names, aliases or sampled data to input schema for a target dataset. For example, multiple columns may be assessed via a batch beam search to reduce the number of inferences. Lists may be prepared for column name and aliases as shown in FIG. 5A and for sample column data as shown in FIG. 5B. The preprocessed and tokenized inputs into the lists and a list priority queue is formed for each target column as beam search candidates as beam search candidates using a top K probably method. All queues are searched in order for each beam step to determine a certain number of candidates for the first mapping model. This is done until all candidates in the list queue are empty or all target columns of a response queue are full.

An element wise average is taken for the vector 504 and the element wise average is concatenated at 512 with the encoded data type 510. Further, the encoded information is considered during the inference stage of the inference module and the output from a previous time step (or training history) is considered to make an output prediction using probability distribution for mapping input data fields from the input application environment to a target data set 514 for a target application environment as a suggested candidate mapping via the decoder step 516. The decoder step 516 may receive target dataset structure, label names, hierarchy or the like via inputs 510 which may be assigned meaning vectors before decoded at 516, for example via another LTSM, into one or more candidate mappings.

These candidate mapping of input dataset fields to target dataset fields may be one of several candidate mappings generated by the inference module. These candidate mappings may be presented to a user customizing a mapping type visual element in modeling a business integration process via an integration application management system.

FIG. 5B is a schematic representation 520 illustrating operation of a data mapping neural network algorithm of an inference module for the universal data mapping pipeline of an embodiment of the present disclosure. FIG. 5B illustrates the utilization of column data samples as information to generate mapping, in accordance with an exemplary embodiment of the present disclosure. The representation 520 utilizes column sample data 522 as information to generate mapping. In an embodiment, 'n' number of data samples from column are considered and the samples are encoded into 'n' feature vectors 524. Element wise maximum of generated vectors are considered as input for inference stage such as inputs into a matched data mapping neural network algorithm in a coder/decoder type format. An encoder step 526 may invoke the matched data mapping neural network algorithm. The encoder step 526 and decoder 530 may operate to conduct an inference phase to generate a probability distribution for mapping input data fields from the input application environment to a target data set 514 for a target application environment as an output mapping prediction. For example, in the shown embodiment, a bi-directional LTSM neural network algorithm may be invoked. Other matched data mapping neural network algorithms may be invoked here according to embodiments herein as matched by a data classification module and determined from identified data classes within input datasets. Further, the encoded information is considered during the inference stage and the output from a previous time step (or training history) is considered to make an output prediction using probability distribution via decoder step 530 for mapping input data fields from the input application environment to a target data set 528 for a target application environment as a suggested candidate mapping. The decoder step 530 may receive target dataset structure, label names, hierarchy or the like via inputs 528 which may be assigned meaning vectors before decoded at 530, for example with another LTSM neural network that takes input from an encoder step, into one or more candidate mappings from the probability distribution of matches to target mapping data fields. These candidate mapping of input dataset fields to target dataset fields may be one of several candidate mappings generated by the inference module. These candidate mappings may be presented to a user customizing a mapping type visual element in modeling a business integration process via an integration application management system.

It is appreciated that the inference module of the universal data mapping pipeline may utilize the column metadata 502 of the schematic representation of the data mapping neural network algorithm operation similar to that shown in FIG. 5A, the column sample data 522 as information to generate data mapping as well as via the data mapping neural network algorithm operation similar to that shown in FIG. 5B, or some partial or full combination of both to generate candidate sample mappings. Further, with multiple classes of data detected in the input data sets via the classification module, multiple data mapping neural network algorithms that are matched to detected data classes may be applied in a coder or decoder format for column metadata or sample column data similar to the applied algorithms shown in FIGS. 5A and 5B. Additional inputs may also be factored in some embodiments including input application identification information, target application identification information, trading partner identification information, customer or user identification, or any known data hierarchy information for input or target datasets. Further, continuous training or updating of the neural network via feedback determine from user selection, non-selection, modification, or input of user generated mapping with the mapping type visual element. These user choices may be input as additional data parameters to modify and update the operation of the data mapping neural network algorithms applied to column metadata or column sample data as shown in FIG. 5A and FIG. 5B.

Figure 6:
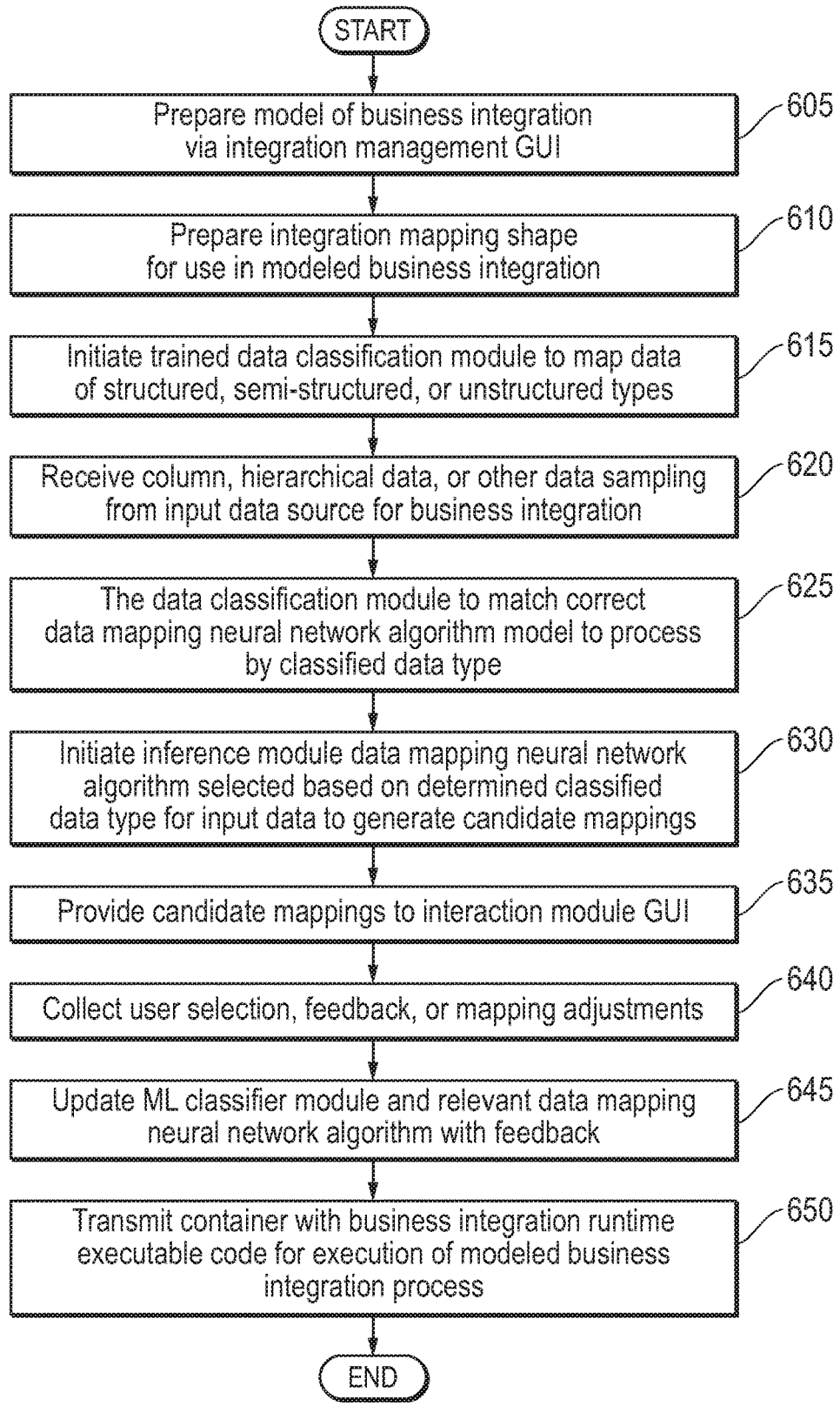
FIG. 6 is a flow diagram illustrating a method of implementing mapping for structured data, unstructured data, or semi-structured data, or other data classes with a universal data mapping pipeline in a modeled business integration according to an embodiment of the present disclosure.

FIG. 6 is a flow diagram illustrating a method of providing candidate mappings via a universal data mapping pipeline accommodating plural data classifications via a business integration application management system user interface according to an embodiment of the present disclosure. The universal data mapping pipeline accommodates plural data classifications from input datasets for modeling a business integration process by detecting data classifications and matching those to compatible data mapping neural network algorithms to generate candidate mappings. As described herein, the business integration application management system in an embodiment may be used with a graphic user interface having various available visual elements or shapes that may be inserted, modified or customized, and linked to model an end to end business integration process by a user.

At block 605, a user may prepare a business integration process via the business integration application management system. Within the user interface of the business integration application management system, the user is presented with a visual interface for modeling the business integration process. As described herein, a GUI displayed via a display screen may provide a visual designer environment permitting a user to define process flows between applications/systems, such as between trading partner and enterprise systems, and to model a customized business integration process through the manipulation of specific visual elements. The business integration application management system user interface provides for one or more visual elements, also referred to as shapes, selectable by the user for the business integration process. Each shape or visual element may be dragged and dropped into the integration application modeling platform of the graphic user interface. The integration shapes or visual elements may each serve various functions or purposes for the modeled business integration process. The visual elements are representative of a code set that is to be executed by a processor in order to manipulate, store, read, write, and transmit data through the business integration processes. The arrangement, use, and customization of these different types of visual elements is arranged and linked to form a modeled business integration process by a user without need for the user to conduct substantial amounts of coding the underlying functions.

Proceeding to block 610, the user may select or have selected an integration data mapping type visual element or shape to be used with the modeled business integration process. In selection of such an integration data mapping type visual element or shape, a customization may be needed in some embodiments whereby mapping between input application dataset field values to target dataset field values is to be conducted. This customization may be time consuming, or potentially confusing, to a user of the business integration application management system.

In an embodiment, upon selection of the data mapping type visual element for use in a business integration process, the business integration application management system may initiate the universal data mapping pipeline of embodiments of the present disclosure at block 615. In a first aspect of the universal data mapping pipeline, the trained data classification module may be implemented to determine the one or more classes of data determined to be in the incoming input dataset to the business integration process. In an example embodiment, as described above, the incoming input dataset may come from an input application environment for applications running at one or more trading partners or other outside data sources. The input datasets may have varied types of data and data fields that may need to be converted and mapped to a format compatible with a target application dataset. The target application dataset may be associated with a target application internal to an enterprise or may be a target application to be interfaced with at an outside location such as in a different trading partner environment or in a particular type of cloud environment.

As described in various embodiments herein, the input dataset may include structured data, unstructured data, or even semi-structured data. The trained data classification module may detect between these types of data for purposes of matching to a data mapping neural network algorithm suitable to assess such data types or data set structures to generate candidate mappings to the target application dataset. Multiple data mapping neural network algorithms may be available to use with the inference module to generate candidate data mappings. Further, various data mapping neural network algorithm models may be better suited for particular subclasses of data within structured data types, unstructured data types, or semi-structured data types. For example, unstructured data comprised of unstructured image data or unstructured text data which may be suited to differing data mapping neural network algorithms in some embodiments. Other examples include varying subclasses of structured data such as tables, comma-separated values (csv) files. Yet other examples include varying subclasses of semi-structured data such as JSONs or XML files.

The data classification module may have been trained previously via inputs of data types from various samples of inputs provided to train a machine learning classifier to classify data types within columns or rows of input datasets in an embodiment based on inputs of column descriptive labels, row descriptive labels if applicable, data hierarchy metadata if any, or sampled data from columns or rows from plural test input data sets. Additional inputs may also be factored in some embodiments including input application identification information, target application identification information, trading partner identification information, customer or user identification, or any known data hierarchy information for input or target datasets. The machine learning classifier is trained to determine from these inputs the classifications of the data types found in test input data sets. Example type of machine learning classifier to determine data type classification from integration input datasets may include sales or customer data or application integration data. It is understood that other supervised learning algorithms may also be used to determine classifications of data from input datasets and may include algorithms such as CNN-RNN variants and SVMs or HMMs. In one example embodiment, the machine learning classifier of the data classification module may determine among structured data and unstructured data. In other example embodiments, the machine learning classifier conducts analysis to determine among structured data, unstructured data, and semi-structured data. In further example embodiments, the machine learning classifier may be trained to determine classes among multiple types of unstructured data, one or more types of structured data, and one or more types of semi-structured data determined from input datasets. The one or more test input datasets to train the machine learning classifier may be derived from datasets managed by a service provider and may be particular to examples of input application environments encountered during the course of users developing business integration processes involving these input application environments. In other words, test input datasets may be crowdsourced by the service provider in some embodiments. Further, the trained machine learning classifiers of the data classification modules may be specific to a detected input application environment in an embodiment. Thus, multiple machine learning classifiers for various input application environment types may be available in a data classification module in some example embodiments.

At block 620, the trained machine learning classifier may be available or accessible as a backend service via the service provider for assisting a user in customizing a data mapping type visual element or shape when developing a business integration process. The data classification module may receive column or row identifying metadata from the input dataset, any hierarchical data structure metadata for the input dataset, or data samples from columns or rows within the input dataset in embodiments herein. Such column or row identifying metadata from the input dataset, any hierarchical data structure metadata for the input dataset, or data samples from columns or rows within the input dataset are utilized as inputs to the trained machine learning classifier. The column or row identifying metadata from the input dataset, any hierarchical data structure metadata for the input dataset, or data samples from columns or rows within the input dataset may be received in some embodiments via the business integration application management system which may utilize a connector for linking to an input application dataset from an input source such as a trading partner server system in one embodiment. In other embodiments, the column or row identifying metadata from the input dataset, any hierarchical data structure metadata for the input dataset, or data samples from columns or rows within the input dataset may be retrieved by the data classification module directly from the input dataset source database such as at a trading partner or other internal or external source.

At block 625, the data classification module determines classes of data within the input dataset and matches those data classes with suitable data mapping neural network algorithms for those types of data classes. With the inputs of column or row identifying metadata from the input dataset, any hierarchical data structure metadata for the input dataset, or data samples from columns or rows within the input dataset, the trained machine learning classifier of the data classification module may determine each data classification present in the input dataset to be transformed by the business integration process. Once the one or more types of data within the input application dataset are determined, the types of determined data classes may be matched with the appropriate data mapping neural network algorithm suited to generate candidate data mappings for that type of data. For example, if the input dataset includes unstructured image data, a CNN algorithm may be selected for this data classification to assist in generating a candidate mapping to a target application dataset in one embodiment. Such a CNN algorithm is suitable for unstructured image data because they work well with object segmentation, classification, or detection. In another embodiment, if the input dataset includes unstructured text data, an LTSM recurrent neural network algorithm may be selected for generation of candidate mappings to a target application dataset in an embodiment. Such a CNN algorithm is suitable for unstructured image data because as images and videos are inherently unstructured. For structured data, such as text data within a structured hierarchy, within an input dataset, a recurrent neural network algorithm may be selected. It is suitable for structured data because as the data can still be formulated by a data translation using techniques like language translation.

Proceeding to block 630, the universal data mapping pipeline has now accommodated a variety of data classifications that may appear within an input dataset to a modeled business integration process. The universal data mapping pipeline may then implement one or more matched data mapping neural network algorithms within an inference module depending on the determined data classifications to generate one or more candidate mappings. Again, the various data mapping neural network algorithms may have been trained for various input datasets crowdsourced for a type of input application and directed to particular target dataset application environments. The various mapping neural network algorithms are also particular to the determined classes of data found with the data classification module. The column or row identifying metadata from the input dataset, any hierarchical data structure metadata for the input dataset, or data samples from columns or rows within the input dataset may be utilized in accordance with embodiments herein as inputs to the one or more selected data mapping neural network algorithms. These trained data mapping neural network algorithms may be used for the particular data classes to map those input dataset entries to a target dataset application environment. One or more trained data mapping neural network algorithms may be applied to different data classes found in the entries of the input dataset. The result may include a plurality of candidate mapping between an input dataset and a target dataset.

At block 635, a graphical representation of the candidate data mappings from the input dataset from a first application to a target data set for a second application to conduct business process integration may be generated. The universal data mapping pipeline may have an interaction module graphical user interface which may be used generate one or more candidate mappings in an embodiment. The candidate mappings are generated from the results of the inference module processing inputs to the data mapping neural network algorithms selected for detected classes of data in the input dataset according to embodiments herein. Those graphical representations of candidate mappings may be displayed by the interaction module on graphical user interface within the integration application management system for assessment or customization of the data mapping type visual element by a user.

Proceeding to block 640, a user may select among plural presented candidate mappings, modify any of the presented candidate mappings, reject one or all candidate mappings, or prepare her own custom, user-generated mapping via the GUI presented interface module for data mapping from an input data set to a target dataset. Any of these actions may be recorded and utilized as feedback to further train or modify the machine learning classifier of the data classification module in an embodiment to provide for better data classification determinations from input datasets. Further, any of the above actions by the user via the interaction module may also be recorded and utilized as feedback for any of the selected data mapping neural network algorithms used to generate candidate mappings for a user.

At block 645, these data indicating actions by a user with the interaction module may be sent to the universal data mapping pipeline to update and modify the trained machine learning classifier in the data classification module and any relevant data mapping neural network algorithm in the inference module. The data indicating user actions may include a user's selection among plural presented candidate mappings, modification of any of the presented candidate mappings, rejection of one or all candidate mappings, or preparation of a user's own custom, user-generated mapping via the GUI to prepare the data mapping from an input data set to a target dataset may be sent to the universal data pipeline as described. The universal data mapping pipeline may operate, for example, at a service provider server or at a cloud location in some embodiments.

The machine learning classifier of the data classification module may utilize the user feedback data as parameter inputs to modify weightings of various factors in making determination of data classes detected from column identifying metadata or from input data set data samples for example. Similarly, the data mapping machine learning algorithms used to generate the candidate mappings may utilize the user feedback actions with the interaction module to update the mappings generated between the input dataset and the target datasets involved with the modeled business integration process in some embodiments. The user feedback may include modified changes in the mapping that a user makes that is different from any initial candidate mappings that were recommended by the system. For example, weighting may be adjusted in one or more layers of the data mapping neural network operations when assessment is made of the inputs of column metadata, samples of input data, any data hierarchy information, or the like from similar input datasets from a type of input application and how such input data entries may match to a target dataset for a type of target application for the business integration process. These adjustments to the data classification module and to the inference module provide for continued, crowdsourced improvement of the universal data mapping pipeline to provide accurate candidate mappings for users of the business integration application management system when customizing data mapping type visual elements or shapes in some embodiments.

Proceeding to block 650, the business integration application management system may accept the user's selection among plural presented candidate mappings, modification of any of the presented candidate mappings, rejection of one or all candidate mappings, or preparation of a user's own custom, user-generated mapping via the GUI to prepare the data mapping from an input data set to a target dataset may be sent to the universal data pipeline as the data mapping for the data mapping type visual element within the modeled business integration process. Once the modeled business integration process is completed by the user to generate an error-free end to end business integration process, the business integration application management system may deploy the business integration process as one or more executable codesets. The business integration application management system may transmit containers of executable runtime code of the modeled business integration process steps, including subprocesses represented by the visual elements or shapes in the business integration process, to a location for execution of the business integration process. For example, execution may take place at a location with a user's enterprise and interface with one or more external trading partners or cloud computing resources in accordance with the example embodiments of FIG. 2. At this point the process may end.

Figure 7:
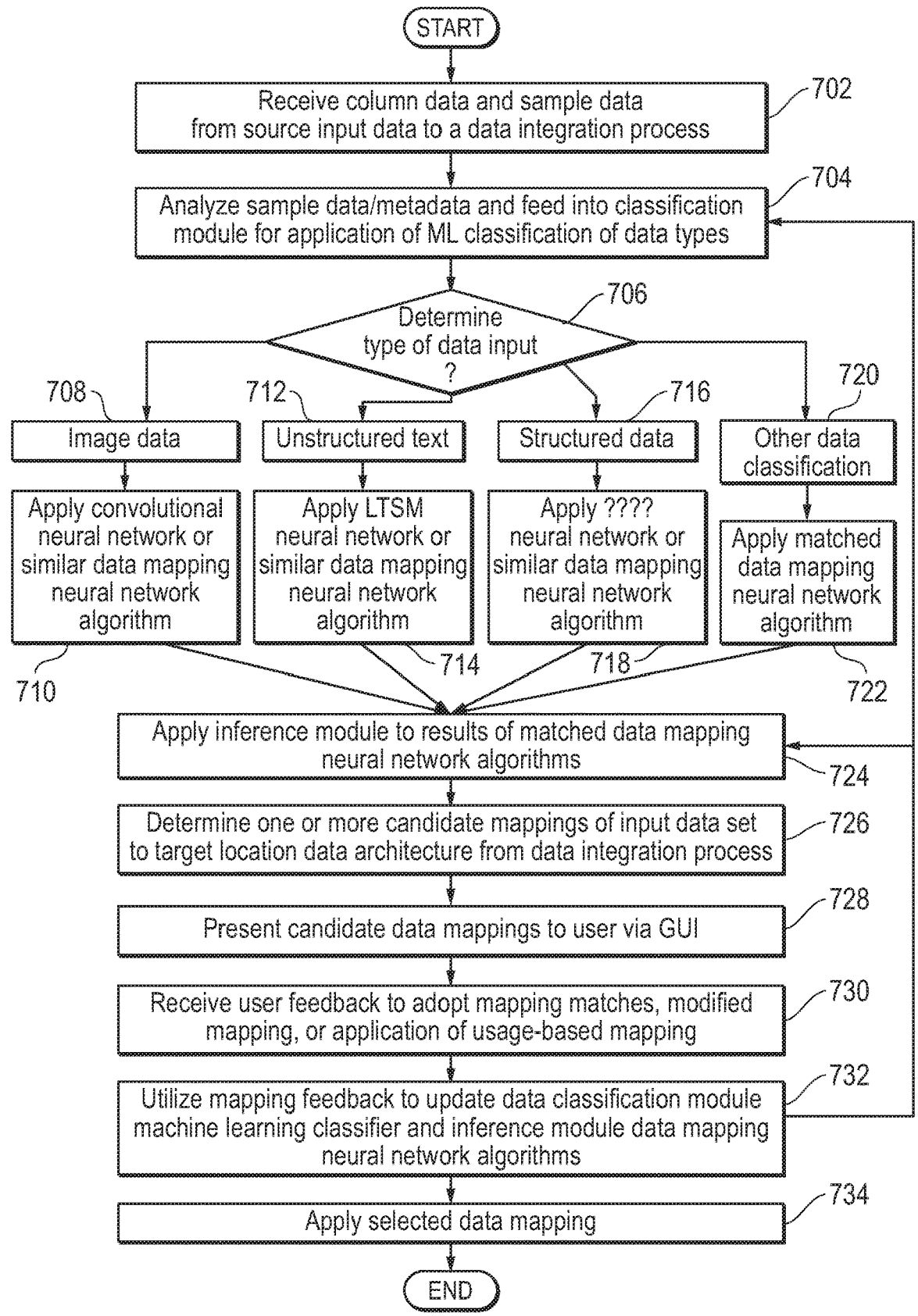
FIG. 7 is a block diagram illustrating a method of implementing mapping for plural varied data classes with a universal data mapping pipeline for generating candidate data mappings according to another embodiment of the present disclosure.

FIG. 7 is a flow diagram illustrating a method operating a universal data mapping pipeline to provide candidate mappings while accommodating plural data classifications for a business integration application management system user interface according to an embodiment of the present disclosure. As described in embodiments herein, the universal data mapping pipeline accommodates plural data classifications from input datasets for modeling a business integration process. The universal data mapping pipeline detects data classifications of data types found in input datasets and matches those to compatible data mapping neural network algorithms to generate candidate mappings in some embodiments. Feedback from user selection, non-selection, modification, or custom user-generated mappings is utilized to update and increase accuracy of the universal data mapping pipeline at a service provider with ongoing, crowd-sourced feedback from plural users of the business integration application management system according to some embodiments herein.

At block 702, the universal data mapping pipeline may be invoked at a service provider when a user of the business integration application management system selects an integration data mapping type visual element or shape to be used with the modeled business integration process. The universal data mapping pipeline may retrieve column identifying data such as labels or other metadata describing an input dataset to a business integration process mapping step from an input data source in an embodiment. The universal data mapping pipeline may retrieve sample data from columns within an input dataset to a business integration process mapping step from an input data source in some embodiments. Other data or metadata may also be retrieved including information identifying the input application environment for the input dataset. For example, identifying information may identify the input application type, a trading partner, an industry type, data fields, or other input data-specific information. Other data or metadata may also be retrieved including information identifying the target application environment for the input dataset. For example, identifying information may identify the target application type, a trading partner or the enterprise with the target application, an industry type, data fields, or other target data-specific information. Additionally, any data hierarchy information may be received from either the input application environment or the target application environment.

Proceeding to block 704, the universal data mapping pipeline may implement a trained data classification module to analyze the received column metadata, column sample data, or other received inputs identifying the input dataset via inputs fed into a machine learning classifier to determine the one or more classes of data determined to be in the incoming input dataset to the business integration process. The data classification module may have been trained previously via inputs of data types from various samples of data provided to train a machine learning classifier to classify data types within columns or rows of input datasets in an embodiment based on inputs of column descriptive labels, row descriptive labels if applicable, data hierarchy metadata if any, or sampled data from columns or rows from plural test input data sets. The machine learning classifier is trained to determine from these inputs the classifications of the data types found in test input data sets. Example type of machine learning classifier to determine data type classification from integration input datasets may include tables, csv files, JSONs, XMLs, image, text blobs, videos or others. It is understood that other supervised learning algorithms may also be used to determine classifications of data from input datasets and may include algorithms such as CNN-RNN variants and SVMs, HMMs. In one example embodiment, the machine learning classifier of the data classification module may determine among structured data and unstructured data. In other example embodiments, the machine learning classifier conducts analysis to determine among structured data, unstructured data, and semi-structured data. In further example embodiments, the machine learning classifier may be trained to determine classes among multiple types of unstructured data, one or more types of structured data, and one or more types of semi-structured data determined from input datasets. The one or more test input datasets to train the machine learning classifier may be derived from datasets managed by a service provider and may be particular to examples of input application environments encountered during the course of users developing business integration processes involving these input application environments. In other words, test input datasets may be crowdsourced by the service provider from many users of the business integration application management system in some embodiments. Further, the trained machine learning classifiers of the data classification modules may be specific to a detected input application environment in an embodiment, and thus several trained machine learning classifiers may be implemented specific to the type of input application detected to provide the input dataset.

At block 706, the data classification module uses the machine learning classifier to determine which type of data classes may be found in the input dataset. In an example embodiment, as described herein, the incoming input dataset may come from an input application environment for applications running at one or more trading partners or other outside data sources. The input datasets may have varied types of data and data fields that may need to be converted and mapped to a format compatible with a target application dataset. Further, the target application dataset may be associated with a target application internal to an enterprise or may be a target application to be interfaced with at an outside location such as in a different trading partner environment or in a particular type of cloud environment. The target application environment may require a target application dataset format different from that of the input dataset, thus requiring a mapping between the input dataset and the target dataset to permit compatibility.

The trained machine learning classifier may be available or accessible as a backend service via the service provider for assisting a user in customizing a data mapping type visual element or shape when developing a business integration process. The data classification module may receive column or row identifying metadata from the input dataset, any hierarchical data structure metadata for the input dataset, or data samples from columns or rows within the input dataset in embodiments herein. Such column or row identifying metadata from the input dataset, any hierarchical data structure metadata for the input dataset, or data samples from columns or rows within the input dataset are utilized as inputs to the trained machine learning classifier. The column or row identifying metadata from the input dataset, any hierarchical data structure metadata for the input dataset, or data samples from columns or rows within the input dataset may be received in some embodiments via the business integration application management system which may utilize a connector for linking to an input application dataset from an input source such as a trading partner server system in one embodiment. In other embodiments, the column or row identifying metadata from the input dataset, any hierarchical data structure metadata for the input dataset, or data samples from columns or rows within the input dataset may be retrieved by the data classification module directly from the input dataset source database such as at a trading partner or other internal or external source. These inputs of column identifiers or sampled column data entered into the machine learning classifier are processed by the classifier to determine what class of data type exists in the input dataset columns (or rows).

In in an embodiment described herein, the machine learning classifier of the data classification module may determine that the input dataset may include unstructured image data in datafields at 708, unstructured text data in datafields at 712, or structured data in datafields at 716, or any of one or more other data classifications at 720. The trained data classification module may detect between these types of data for purposes of matching to a data mapping neural network algorithm suitable to assess such data classifications for generating candidate mappings to the target application dataset. Multiple data mapping neural network algorithms may be available to use with the inference module to generate candidate data mappings.

For example, if unstructured image data 708 is determined to be in the input dataset by the data classification module at 706, flow proceeds to block 710. At block 710, the data classification module matches the unstructured image data 708 with a convolutional neural network (CNN) algorithm or other suitable data mapping neural network algorithm for this data class. This CNN or other suitable data mapping neural network algorithm may have been trained via test input datasets provided via crowdsourcing for datasets with unstructured image data 708 in an embodiment.

In another embodiment, if unstructured text data 712 is determined to be in the input dataset by the data classification module at 706, flow proceeds to block 714. At block 714, the data classification module matches the unstructured text data 712 with a long/short term memory (LTSM) recurrent neural network algorithm or another suitable data mapping neural network algorithm for this data class. This LTSM neural network algorithm or other suitable data mapping neural network algorithm may have been trained via test input datasets provided via crowdsourcing for datasets with unstructured text data 712 in an embodiment.

In another embodiment, if structured data 716 is determined to be in the input dataset by the data classification module at 706, flow proceeds to block 718. At block 718, the data classification module matches the structured data 716 with an LSTM/RNN neural network algorithm or another suitable data mapping neural network algorithm for this data class. This LSTM/RNN neural network algorithm or other suitable data mapping neural network algorithm may have been trained via test input datasets provided via crowdsourcing for datasets with structured data 716 in an embodiment.

In yet another embodiment, any number of other data classifications may be identified by the data classification module for the universal data mapping pipeline. For example, if any other class of data 720 is determined to be in the input dataset by the data classification module at 706, flow proceeds to block 722. At block 722, the data classification module matches the other class or classes of data 720 with a suitable data mapping neural network algorithm for this data class. As before, this suitable data mapping neural network algorithm may have been trained with test input datasets provided via crowdsourcing for datasets with the other class or classes of data 720 in an embodiment.

For each of the suitable data mapping neural network algorithms matched to the classes of data types 708, 712, 714, or 720 that may be detected in the input dataset, the selected data mapping neural network algorithm may also be specific for mapping from the identified input application environment of the input dataset to the business integration process in some embodiments. Additionally, the selected data mapping neural network algorithm may also be specific for mapping to the identified target application environment of the target dataset to the business integration process in some embodiments.

This determination of various data classes is conducted because particular data mapping neural network algorithm models may be better suited for different classes or subclasses of data within structured data types, unstructured data types, or semi-structured data types that may be found in input datasets. For example, unstructured data may be comprised of unstructured image data or unstructured text data, each of which may be better suited to different data mapping neural network algorithms in some embodiments. Other examples include various subclasses of structured data such as tables or csv-files. Yet other examples include varying subclasses of semi-structured data such as JSONs or XMLs.

At block 724, the universal data mapping pipeline may implement one or more data mapping neural network algorithms matched to the determined data classes found in the input data set. An inference module may use input dataset column identifying information or sample input column data to generate a candidate mapping between an input application dataset and a target application dataset. Additionally, inputs to a data mapping neural network algorithm to generate candidate mappings may include any data hierarchy information, identification of input application type, identification of target application type, identification of a trading partner or enterprise, or other metadata information. The generation of one or more candidate mappings which may accommodate multiple possible data classifications in the input dataset may result from application of the data mapping neural network algorithm or algorithms by the inference module.

The column or row identifying metadata from the input dataset, data samples from columns or rows within the input dataset, any hierarchical data structure metadata for the input dataset, or identification of input application environments or target application environments may be utilized in accordance with embodiments herein as inputs to the one or more selected data mapping neural network algorithms. These trained data mapping neural network algorithms may be used for the particular data classes to map those input dataset entries to a target dataset application environment. One or more trained data mapping neural network algorithms may be applied to different data classes found in the entries of the input dataset. As discussed below, additional inputs to the inference module may include user selection, non-selection, modifications, or user-generated mappings for mapping between an input dataset and a target dataset. This user feedback information may also be utilized to update and refine the one or more selected data mapping neural network algorithms used to generate candidate mappings.

Proceeding to block 726, the result of application of the one or more data mapping neural network algorithms may include a plurality of candidate mappings between an input dataset and a target dataset. This plurality of candidate mappings, if accepted within tolerances of error by the particular data mapping neural network algorithms applied by the inference module, may be stored as candidate mapping suggestions to be presented to a user developing the business integration process.

At block 728, a graphical representation of the candidate data mappings from the input dataset to the target data set may be generated for display via a user interaction module of the universal data mapping pipeline. This interaction module may present the candidate mapping via an interaction module GUI that is accessible within or linked from the GUI for modelling business integration process development with the business integration application management module. The universal data mapping pipeline may present one or more generated graphics depicting candidate mappings within the interaction module graphical user interface within a customization management page for a data mapping type visual element or shape in an embodiment. The candidate mappings are generated from the results of processing inputs described above by the inference module using the one or more selected data mapping neural network algorithms according to embodiments herein.

Proceeding to block 730, the universal data mapping pipeline may receive user feedback via the interaction module GUI that presents the candidate mappings to the user developing a business integration process. For example, a user may select among plural presented candidate mappings, modify any of the presented candidate mappings, reject one or all candidate mappings, or prepare her own custom, user-generated mapping via the GUI presented interface module to prepare the data mapping from an input data set to a target dataset. Proceeding to block 732, any of these actions may be recorded by the interaction module and fed back to the data classification module at 704 in an embodiment to further train or modify the machine learning classifier to provide for better data classification determinations from input datasets. Further, any of the above actions by the user may be recorded by the interaction module at 724 and fed back via the interaction module to block 724 to update and improve operation of any of the selected data mapping neural network algorithms of the inference module used to generate candidate mappings between an input application dataset and a target application dataset to assist a user in customizing a data mapping type visual element or shape.

As described in embodiments herein, the recorded data indicating actions by a user with the interaction module may be sent to the universal data mapping pipeline to update and modify the trained machine learning classifier in the data classification module at 704 and any relevant data mapping neural network algorithm in the inference module at 724. The machine learning classifier of the data classification module may utilize the user feedback data returned to 704 as parameter inputs to modify weightings of various factors in making determination of data classes detected from column identifying metadata or from input data set data samples for example. Similarly, the data mapping machine learning algorithms used to generate the candidate mappings may utilize the user feedback actions returned with the interaction module at 724 to update the mappings generated between the input dataset and the target datasets involved with the modeled business integration process in some embodiments. For example, weighting may be adjusted in one or more layers of the data mapping neural network operations when assessment is made of the inputs of column metadata, samples of input data, any data hierarchy information, or the like from input datasets. These weighting adjustments and parameter inputs may also be specific to an identified type of input application or an identified target application. These updates and adjustments to the one or more selected data mapping neural network algorithms may adjust how such input data entries may match to data entries at a target dataset for a type of target application when mapping for a business integration process. These adjustments to the data classification module and to the inference module provide for continued, crowd-sourced improvement of the universal data mapping pipeline to provide accurate candidate mappings. This increased accuracy of candidate datasets will further assist users of the business integration application management system when customizing data mapping type visual elements or shapes in some embodiments.

Proceeding to block 734, the business integration application management system may accept the user's selection among plural presented candidate mappings, modification of any of the presented candidate mappings, rejection of one or all candidate mappings, or the preparation of a user's own custom, user-generated mapping via the GUI. This selection of candidate data mappings, modification, or user-generated data mapping may be used in the business integration process and applied as the data mapping from an input data set to a target dataset within the modeled business integration process. The business integration process may be implemented according to the embodiments of the business integration application management system as described herein. At this point the process may end.

The blocks of the flow diagrams of FIGS. 6 and 7 discussed above need not be performed in any given or specified order and may be executed as code instructions at one or a plurality of processors during preparation and set up of a modeled integration process or of a deployed integration process as described herein. It is contemplated that additional blocks, steps, or functions may be added, some blocks, steps or functions may not be performed, blocks, steps, or functions may occur contemporaneously, and blocks, steps or functions from one flow diagram may be performed within another flow diagram. Further, those of skill will understand that additional blocks or steps, or alternative blocks or steps may occur within the flow diagrams discussed for the algorithms above.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system operating an integration application management system with a universal data mapping pipeline system comprising:
   a processor executing code instructions of integration application management system for modelling, via a graphical user interface (GUI), a business integration process having linked integration process visual elements including a data mapping type visual element;
   the processor executing code of the universal data type mapping pipeline system for the mapping integration process visual element to:

receive first application input data including at least two of structured data, unstructured data, or semi-structured data to the business integration process via a network interface;

input sampled data and column metadata from the first application input data into a classification module having a machine learning classifier to determine the one or more data classifications in the first application input data;

select, via an inference module, among a plurality of neural network mapping algorithms corresponding to each of the one or more data classifications determined to be in the first application input data;

generate, with the selected neural network mapping algorithm for each data classification present, a plurality of sample data mappings to a second application in the business integration process; and the processor presenting the plurality of sample data mappings between the first application and the second application to a user via the GUI for the data mapping type visual element.

2. The information handling system of claim 1 further comprising:
the processor receiving indication of a selection of one of the plurality of sample data mappings between the first application and the second application by the user via the GUI while modelling the business integration process.

3. The information handling system of claim 2 further comprising:
the processor applying selection or non-selection of each of the plurality of sample data mappings between the first application and the second application as further training to the machine learning algorithm of the classifier module.

4. The information handling system of claim 2 further comprising:
the processor applying selection or non-selection of each of the plurality of sample data mappings between the first application and the second application as further training to the neural network mapping algorithm of the inference module.

5. The information handling system of claim 1 further comprising:
the processor receiving indication of a modification of one of the plurality of sample data mappings to be adopted as the mapping between the first application and the second application by the user via the GUI while modelling the business integration process; and
the processor applying the modified mapping as further training to the neural network mapping algorithm of the inference module.

6. The information handling system of claim 1 further comprising:
the processor receiving indication of a usage-based mapping entered by a user instead of adopting one of the plurality of sample data mappings as the mapping between the first application and the second application by the user via the GUI while modelling the business integration process; and
the processor applying the usage-based mapping as further training to the neural network mapping algorithm of the inference module.

7. The information handling system of claim 1 wherein a detected classification of unstructured image data corresponds to utilization of a convolutional neural network as the neural network mapping algorithm in the inference module.

8. A computer implemented method of intelligent mapping of data between a first application and a second application for a business integration process comprising:
executing code instructions, via a processor, modelling the business integration process having linked integration process visual elements including a data mapping type visual element via a graphical user interface (GUI);

executing code of universal data type mapping pipeline system for the data mapping type visual element to classify received first application input data via a classifier module including a machine learning classifier to determine the one or more data classifications in the first application input data from at least structured data, unstructured data, or semi-structured data;

select, via an inference module of the universal data type mapping pipeline, among a plurality of neural network mapping algorithms corresponding to each of the one or more data classifications determined to be in the first application input data;

generate, with the selected neural network mapping algorithm, a plurality of sample data mappings to the second application in the business integration process; and display the plurality of sample data mappings between the first application and the second application to a user via the GUI for the data mapping type visual element.

9. The method of claim 8 further comprising:
receiving indication of a selection of one of the plurality of sample data mappings between the first application and the second application by the user via the GUI while modelling the business integration process.

10. The method of claim 8 wherein the classifier module classifies the received first application input data with the machine learning classifier based on column metadata and sampled data from the first application input data.

11. The method of claim 8 further comprising:
applying selection or non-selection of each of the plurality of sample data mappings between the first application and the second application by the user for the data mapping type visual element as further training to the selected neural network mapping algorithm of the inference module.

12. The method of claim 8 further comprising:
applying selection or non-selection of each of the plurality of sample data mappings between the first application and the second application by the user for the data mapping type visual element as further training to the machine learning algorithm of the classifier module.

13. The method of claim 8 further comprising:
applying modification of one of the plurality of sample data mappings between the first application and the second application by the user for the data mapping type visual element as further training to the selected neural network mapping algorithm of the inference module.

14. The method of claim 8 wherein a detected classification of unstructured text data corresponds to utilization of a long/short term memory (LTSM) neural network as the neural network mapping algorithm in the inference module.

15. An information handling system operating an integration application management system with a universal data mapping pipeline system comprising:

a processor executing code instructions of integration application management system for modelling, via a graphical user interface (GUI), a business integration process including a data mapping type visual element;

the processor executing code of the universal data type mapping pipeline system for the data mapping type visual element to:

classify first application input data via a classification module having a machine learning classifier to determine the one or more data classifications in the first application input data from data classification including structured data, unstructured data, or semi-structured data;

select, via an inference module, among a plurality of neural network mapping algorithms corresponding to each of the one or more data classifications determined to be in the first application input data;

generate, with the selected neural network mapping algorithm, a plurality of sample data mappings to a second application in the business integration process; and the processor presenting the plurality of sample data mappings between the first application and the second application to a user via the GUI for the data mapping type visual element.

16. The information handling system of claim 15 where sampled data and column metadata from the first application input data are input into the classification module to determine the one or more data classifications in the first application input data.

17. The information handling system of claim 15 further comprising:

the processor transmitting a business integration runtime executable for execution of the modeled business integration process including a data mapping selected by the user for the data mapping type visual element.

18. The information handling system of claim 15 further comprising:

the processor applying selection or non-selection by the user of each of the plurality of sample data mappings between the first application and the second application as further training to the machine learning algorithm of the classifier module.

19. The information handling system of claim 15 further comprising:

the processor applying selection or non-selection by the user of each of the plurality of sample data mappings between the first application and the second application as further training to the neural network mapping algorithm of the inference module.

20. The information handling system of claim 15 further comprising:

the processor receiving indication of a usage-based mapping entered by a user instead of adopting one of the plurality of sample data mappings as the mapping between the first application and the second application by the user via the GUI while modelling the business integration process; and the processor applying the usage-based mapping as further training to the neural network mapping algorithm of the inference module.

* * * * *